(12) United States Patent
Kori et al.

(10) Patent No.: US 12,147,160 B2
(45) Date of Patent: Nov. 19, 2024

(54) RESIST UNDERLAYER FILM MATERIAL, PATTERNING PROCESS, AND METHOD FOR FORMING RESIST UNDERLAYER FILM

(71) Applicant: SHIN-ETSU CHEMICAL CO., LTD., Tokyo (JP)

(72) Inventors: Daisuke Kori, Joetsu (JP); Takayoshi Nakahara, Joetsu (JP); Yusuke Biyajima, Joetsu (JP); Yuji Harada, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 232 days.

(21) Appl. No.: 17/521,851

(22) Filed: Nov. 8, 2021

(65) Prior Publication Data
US 2022/0163890 A1 May 26, 2022

(30) Foreign Application Priority Data
Nov. 25, 2020 (JP) .................. 2020-194784

(51) Int. Cl.
*G03F 7/11* (2006.01)
*G03F 7/004* (2006.01)
(Continued)

(52) U.S. Cl.
CPC .............. *G03F 7/11* (2013.01); *G03F 7/0045* (2013.01); *G03F 7/094* (2013.01); *G03F 7/162* (2013.01);
(Continued)

(58) Field of Classification Search
CPC ........................................................ G03F 7/11
See application file for complete search history.

(56) References Cited

U.S. PATENT DOCUMENTS

2002/0106909 A1  8/2002  Kato et al.
2005/0255712 A1  11/2005  Kato et al.
(Continued)

FOREIGN PATENT DOCUMENTS

CN  104603691 A  5/2015
CN  107589633 A  1/2018
(Continued)

OTHER PUBLICATIONS

May 16, 2022 Extended Search Report issued in European Patent Application No. 21208828.0.
(Continued)

*Primary Examiner* — Mark F. Huff
*Assistant Examiner* — Nicholas E Brown
(74) *Attorney, Agent, or Firm* — Oliff PLC

(57) ABSTRACT

A resist underlayer film material contains: one or more compounds shown by the following general formula (1); and an organic solvent. W represents an organic group with a valency of "n" having 2 to 50 carbon atoms; X represents a terminal group structure shown by the following general formula (2) or (3); when a ratio of the structure of the following general formula (2) to that of (3) is "a" to "b", "a" and "b" satisfy the relations $0.70 \leq a \leq 0.99$ and $0.01 \leq b \leq 0.30$. "n" represents an integer of 1 to 10. Z represents an aromatic group with a valency of (k+1) having 6 to 20 carbon atoms. "A" represents a single bond or $-O-(CH_2)_p-$. "k" represents an integer of 1 to 5. "p" represents an integer of 1 to 10. L represents a single bond or $-(CH_2)_r-$. "l" represents 2 or 3; and "r" represents an integer of 1 to 5.

$$W-(X)_n \quad (1)$$

(Continued)

-continued

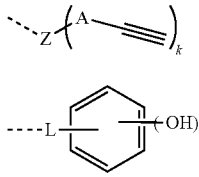

(2)

----L—⟨benzene⟩—(OH)$_l$ (3)

11 Claims, 3 Drawing Sheets

(51) Int. Cl.
  *G03F 7/09* (2006.01)
  *G03F 7/16* (2006.01)
  *G03F 7/20* (2006.01)
  *G03F 7/32* (2006.01)
  *G03F 7/34* (2006.01)
  *G03F 7/38* (2006.01)

(52) U.S. Cl.
  CPC ............ *G03F 7/2006* (2013.01); *G03F 7/322* (2013.01); *G03F 7/34* (2013.01); *G03F 7/38* (2013.01)

(56) References Cited

U.S. PATENT DOCUMENTS

| | | |
|---|---|---|
| 2009/0274978 A1 | 11/2009 | Ohashi et al. |
| 2013/0302990 A1 | 11/2013 | Watanabe et al. |
| 2015/0185613 A1 | 7/2015 | Toyokawa et al. |
| 2016/0085152 A1 | 3/2016 | Nakafuji et al. |
| 2016/0257842 A1 | 9/2016 | Wakamatsu et al. |
| 2016/0259247 A1 | 9/2016 | Toyokawa et al. |
| 2016/0336189 A1* | 11/2016 | Kori .................. H01L 21/31058 |
| 2017/0183531 A1 | 6/2017 | Kori et al. |
| 2018/0011405 A1* | 1/2018 | Watanabe ............. G03F 7/0752 |
| 2018/0114698 A2 | 4/2018 | Nakafuji et al. |
| 2018/0284614 A1* | 10/2018 | Satoh ...................... G03F 7/322 |
| 2019/0391493 A1 | 12/2019 | Tachibana et al. |
| 2020/0401046 A1 | 12/2020 | Nakasugi et al. |
| 2021/0070727 A1 | 3/2021 | Echigo |

FOREIGN PATENT DOCUMENTS

| | | |
|---|---|---|
| CN | 108693713 A | 10/2018 |
| EP | 3 572 393 A1 | 11/2019 |
| EP | 3 584 240 A1 | 12/2019 |
| JP | 2002-334869 A | 11/2002 |
| JP | 2004-205685 A | 7/2004 |
| JP | 2007-199653 A | 8/2007 |
| JP | 2009-269953 A | 11/2009 |
| JP | 2013-253227 A | 12/2013 |
| JP | 2016-167047 A | 9/2016 |
| JP | 2017-119670 A | 7/2017 |
| WO | 2004/066377 A1 | 8/2004 |
| WO | 2019/121480 A1 | 6/2019 |

OTHER PUBLICATIONS

Apr. 11, 2024 Office Action issued in Chinese Patent Application No. 202111402884X.

\* cited by examiner

[FIG. 1]
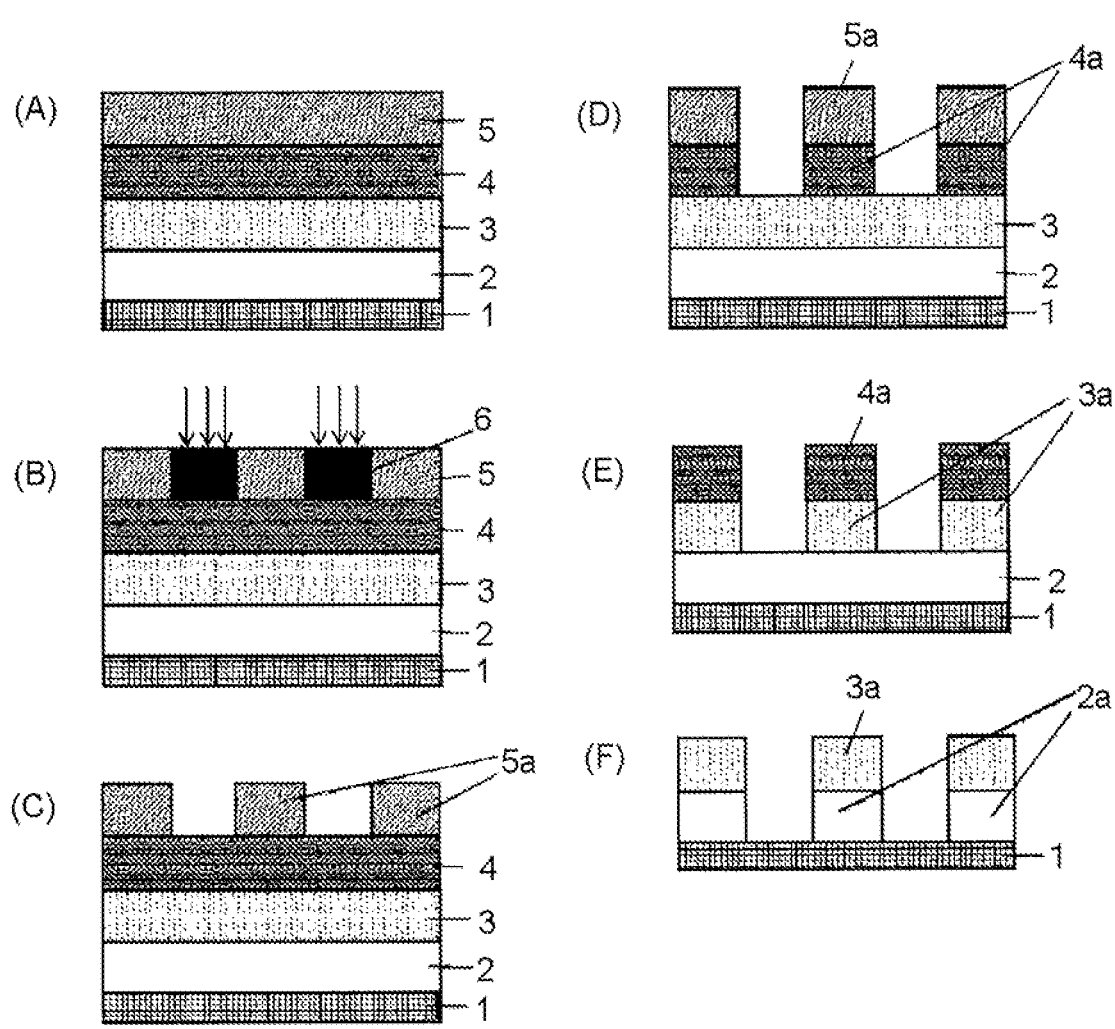

[FIG. 2]
(G)
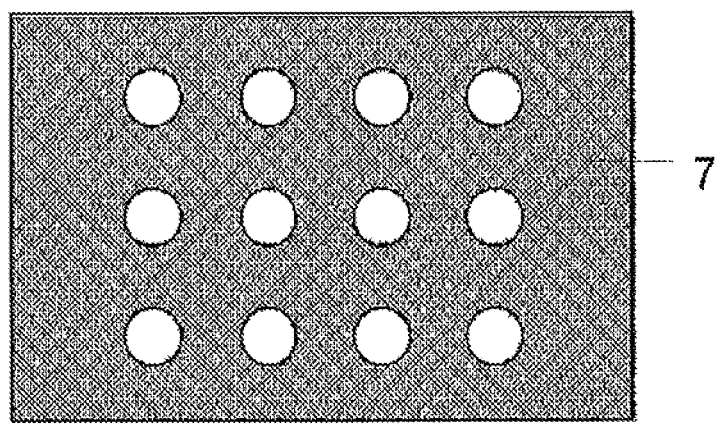
(H)
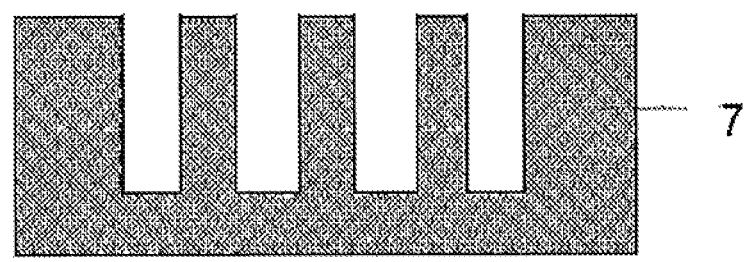
(I)
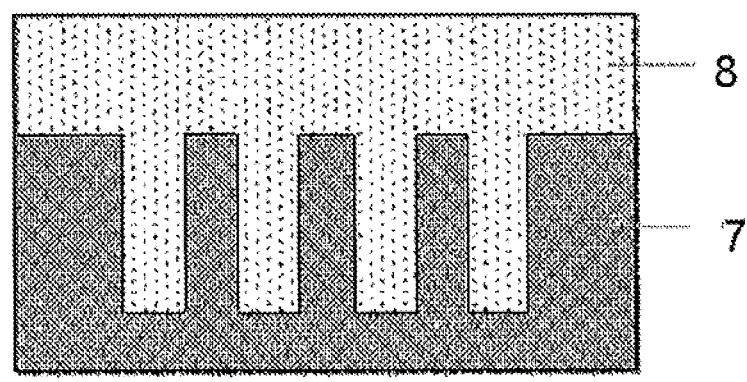

[FIG. 3]
(J)
(K)
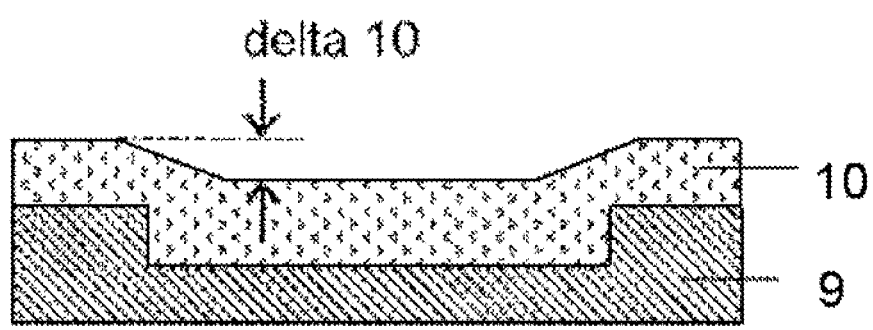

RESIST UNDERLAYER FILM MATERIAL, PATTERNING PROCESS, AND METHOD FOR FORMING RESIST UNDERLAYER FILM

TECHNICAL FIELD

The present invention relates to: a resist underlayer film material used for fine patterning according to a multilayer resist method in a semiconductor device manufacturing process; a patterning process using the material; and a method for forming a resist underlayer film.

BACKGROUND ART

As LSI advances toward high integration and high processing speed, miniaturization of pattern size is progressing rapidly. Along with the miniaturization, lithography technology has achieved a fine patterning by shortening the wavelength of a light source and selecting an appropriate resist composition accordingly. The composition mainly used is a positive photoresist composition for monolayer. The monolayer positive photoresist composition not only allows a resist resin to have a skeleton having etching resistance against dry etching with chlorine- or fluorine-based gas plasma, but also provides a switching mechanism that makes an exposed part soluble, thereby dissolving the exposed part to form a pattern and processing a substrate to be processed by dry etching while using the remaining resist pattern as an etching mask.

However, there arises a problem that when the pattern becomes finer, that is, the pattern width is reduced without changing the thickness of the photoresist film to be used, resolution performance of the photoresist film is lowered. In addition, pattern development of the photoresist film with a developer excessively increases a so-called aspect ratio of the pattern, resulting in pattern collapse. Therefore, the photoresist film has been thinned along with the miniaturization of the pattern.

On the other hand, a substrate to be processed has been generally processed by dry etching while using a pattern-formed photoresist film as an etching mask. In practice, however, there is no dry etching method capable of providing an absolute etching selectivity between the photoresist film and the substrate to be processed. There has been a problem that the resist film is thus damaged and collapses during processing of the substrate, and the resist pattern cannot be precisely transferred to the substrate to be processed. Accordingly, higher dry etching resistance has been required in a resist composition along with the miniaturization of the pattern. However, on the other hand, resins used for photoresist compositions have been required to have low absorbance at the wavelength to be used for the exposure in order to achieve a higher resolution. Accordingly, as the exposure light shifts from i-beam to KrF and to ArF to have a shorter wavelength, the resin also shifts to novolak resins, polyhydroxystyrene, and resins having an aliphatic polycyclic skeleton. This shift actually accelerates an etching rate under the dry etching conditions during substrate processing, and recent photoresist compositions having high resolution tend to have low etching resistance.

As a result, a substrate to be processed has to be dry-etched with a thinner photoresist film having lower etching resistance. It is important to provide a material for this process and the process itself.

A multilayer resist method is one solution for these problems. This method is as follows: a middle layer film having a different etching selectivity from a photoresist film (i.e., a resist upper layer film) is placed between the resist upper layer film and a substrate to be processed; a pattern is formed in the resist upper layer film; then, the pattern is transferred to the middle layer film by dry etching while using the resist upper layer film pattern as a dry etching mask; and the pattern is further transferred to the substrate to be processed by dry etching while using the middle layer film as a dry etching mask.

One of the multilayer resist methods is a 3-layer resist method, which can be performed with a typical resist composition used in the monolayer resist method. For example, this 3-layer resist method includes the following steps: an organic film containing a novolak resin or the like is formed as a resist underlayer film on a substrate to be processed; a silicon-containing film is formed thereon as a resist middle layer film; and a usual organic photoresist film is formed thereon as a resist upper layer film. Since the organic resist upper layer film exhibits a favorable etching selectivity ratio relative to the silicon-containing resist middle layer film when dry etching is performed with fluorine-based gas plasma, the resist upper layer film pattern can be transferred to the silicon-containing resist middle layer film by dry etching with fluorine-based gas plasma. According to this process, even when using a resist composition which is difficult to form a pattern in so that the pattern has a sufficient film thickness for directly processing the substrate to be processed or a resist composition which does not have sufficient dry etching resistance for processing the substrate, a pattern can be transferred to a silicon-containing film (resist middle layer film). In addition, by subsequently transferring the pattern by dry etching using an oxygen- or hydrogen-based gas plasma, it is possible to obtain a pattern of an organic film (resist underlayer film) containing a novolak resin or the like having a sufficient dry etching resistance for processing the substrate. As such a resist underlayer film, many are already known, such as those disclosed in Patent Document 1, for example.

Meanwhile, in recent years, consideration of the production of semiconductor devices having a new structure such as a multigate structure has become active. In response, demands are rising for a resist underlayer film having better planarizing property and filling property than before. For example, when an underlying substrate to be processed has a fine pattern structure such as a hole, a trench, or a fin, it is necessary to have filling (gap-filling) property for filling in the pattern with a film without any voids by using a resist underlayer film. In addition, when the underlying substrate to be processed has a step(s), or when a pattern-dense region and a pattern-free region exist on the same wafer, it is necessary to planarize the film surface with the resist underlayer film. By planarizing the surface of the underlayer film, fluctuation in the film thickness of a resist middle layer film or a resist upper layer film formed thereon is controlled, whereby a focus margin in lithography or a margin in the processing step of the substrate to be processed thereafter can be suppressed from decreasing.

Moreover, the organic film material excellent in filling and planarizing properties is not limited to the underlayer film for a multilayer resist, and is also widely usable as a planarizing material for manufacturing a semiconductor device, e.g., for planarizing a substrate prior to patterning by nanoimprinting. Furthermore, for global planarizing in the semiconductor device manufacturing process, a CMP process is now generally used. However, the CMP process is costly, so that this material is also expected to be used for the global planarizing method, instead of CMP.

For forming a flat film for planarizing an uneven semiconductor substrate, a resist underlayer film material containing a compound having a certain structure including an aromatic group portion having a terminal triple bond and a chain ether portion is proposed (Patent Document 2). However, planarizing performance etc. of the material in wide trench portions in the substrate are insufficient to meet the demands in cutting-edge devices, and a resist underlayer film material excellent in flatness on a wider range of substrate structures has come to be required.

In addition, the structures of substrates to be processed are becoming complex as described above. Furthermore, for the surface of a substrate to be processed, the following materials are also being examined: novel materials having high electron mobility using strained silicon, gallium arsenic, and so forth; ultrathin polysilicon controlled in units of angstrom; and the like. Thus, films are expected to be formed on surfaces of substrates to be processed having various shapes and qualities. Therefore, in order to ensure a process margin, not only excellent filling and planarizing properties, but also being able to form a film without dependence on the quality or shape of the substrate to be processed is an important feature.

CITATION LIST

Patent Literature

Patent Document 1: JP 2004-205685 A
Patent Document 2: JP 2017-119670 A

SUMMARY OF INVENTION

Technical Problem

The present invention has been made in view of the above-described circumstances. An object of the present invention is to provide: a resist underlayer film material in a fine patterning process by a multilayer resist method in a semiconductor device manufacturing process, where the resist underlayer film material makes it possible to form a resist underlayer film excellent in flatness and film-formability even on a substrate to be processed having portions that are particularly difficult to planarize such as a wide trench structure, and the material further has an appropriate etching property and optical characteristics; a patterning process in which the material is used; and a method for forming a resist underlayer film.

Solution to Problem

To solve the above-described problems, the present invention provides a resist underlayer film material for use in a multilayer resist method, comprising:
(A) one or more compounds shown by the following general formula (1); and
(B) an organic solvent, $$W(X)_n \quad (1)$$

wherein W represents an organic group with a valency of "n" having 2 to 50 carbon atoms; X represents either of terminal group structures shown by the following general formula (2) and the following general formula (3); when a ratio of the structure of the following general formula (2) to the structure of the following general formula (3) each constituting the X is "a" to "b", "a" and "b" satisfy the relations a+b=1.0, 0.70≤a≤0.99, and 0.01≤b≤0.30; and "n" represents an integer of 1 to 10,

(2)

wherein a broken line represents a bonding arm; Z represents an aromatic group with a valency of (k+1) having 6 to 20 carbon atoms; A represents a single bond or —O—(CH$_2$)$_p$—; "k" represents an integer of 1 to 5; and "p" represents an integer of 1 to 10,

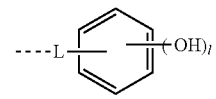
(3)

wherein a broken line represents a bonding arm; L represents a single bond or —(CH$_2$)$_r$—; "l" represents 2 or 3; and "r" represents an integer of 1 to 5.

With such a resist underlayer film material, it is possible to form a resist underlayer film excellent in flatness and film-formability even on a substrate to be processed having portions that are particularly difficult to planarize such as a wide trench structure. In addition, with a resist underlayer film material in which "a" and "b" satisfy the above-described relations, it becomes possible to form a resist underlayer film that can achieve both flatness and film-formability.

Furthermore, A in the general formula (2) preferably represents —OCH$_2$—.

With such a resist underlayer film material, film shrinking due to thermosetting can be suppressed, and it is possible to form a resist underlayer film that is excellent in flatness.

Furthermore, the general formula (2) is preferably any one of the following formula (4), formula (5), or formula (6),

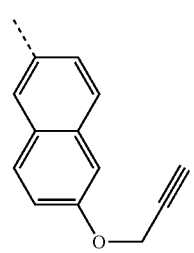
(4)

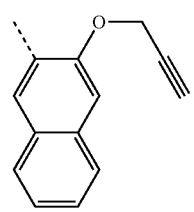
(5)

-continued (6)

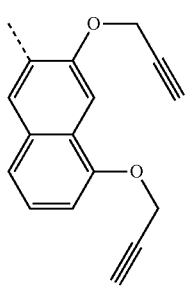

wherein a broken line represents a bonding arm.

Such a resist underlayer film material makes it possible to provide not only the effect of improving flatness by suppressing shrinkage, but also various properties such as heat resistance and etching resistance. Thus, it is possible to form a resist underlayer film excellent in process margin.

Furthermore, the general formula (3) is preferably either one of the following formula (7) or (8),

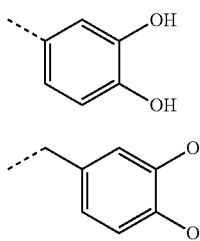

wherein a broken line represents a bonding arm.

By introducing such a terminal group structure to the resist underlayer film material, not only is adhesiveness to a substrate provided, film-formability can also be improved.

In addition, W in the general formula (1) is preferably represented by the following general formula (9),

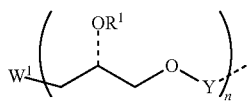

wherein a broken line represents a bonding arm; $R^1$ represents a hydrogen atom or an alkyl group or an acyl group having 1 to 20 carbon atoms and optionally having an oxygen atom or a nitrogen atom; $W^1$ represents an organic group with a valency of "n" having 1 to 47 carbon atoms; Y represents a single bond or a carbonyl group; and "n" represents an integer of 1 to 10.

Such resist underlayer film materials make it possible to form a film regardless of the shape and structure of the substrate, and a resist underlayer film excellent in flatness can be formed.

Furthermore, $W^1$ in the general formula (9) preferably represents a structure shown by any of the following formulae,

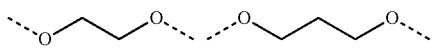

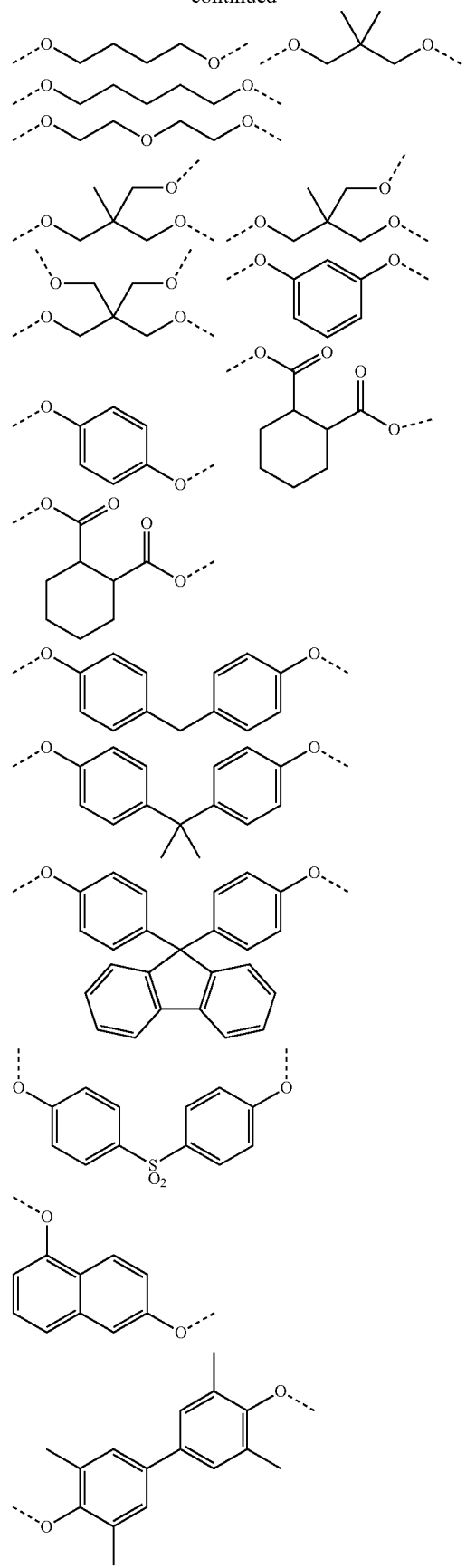

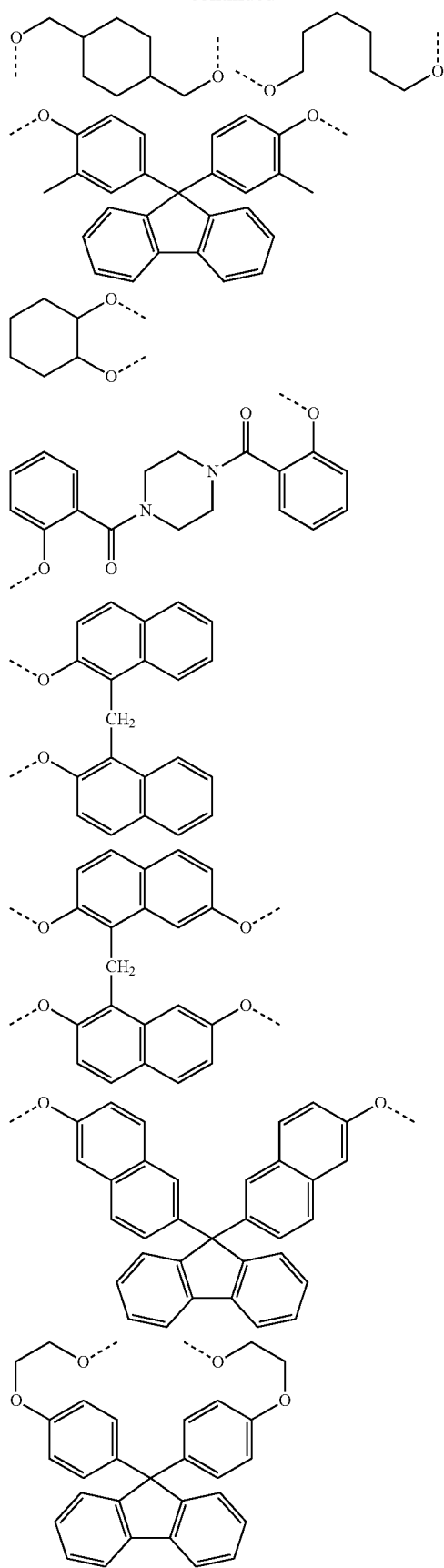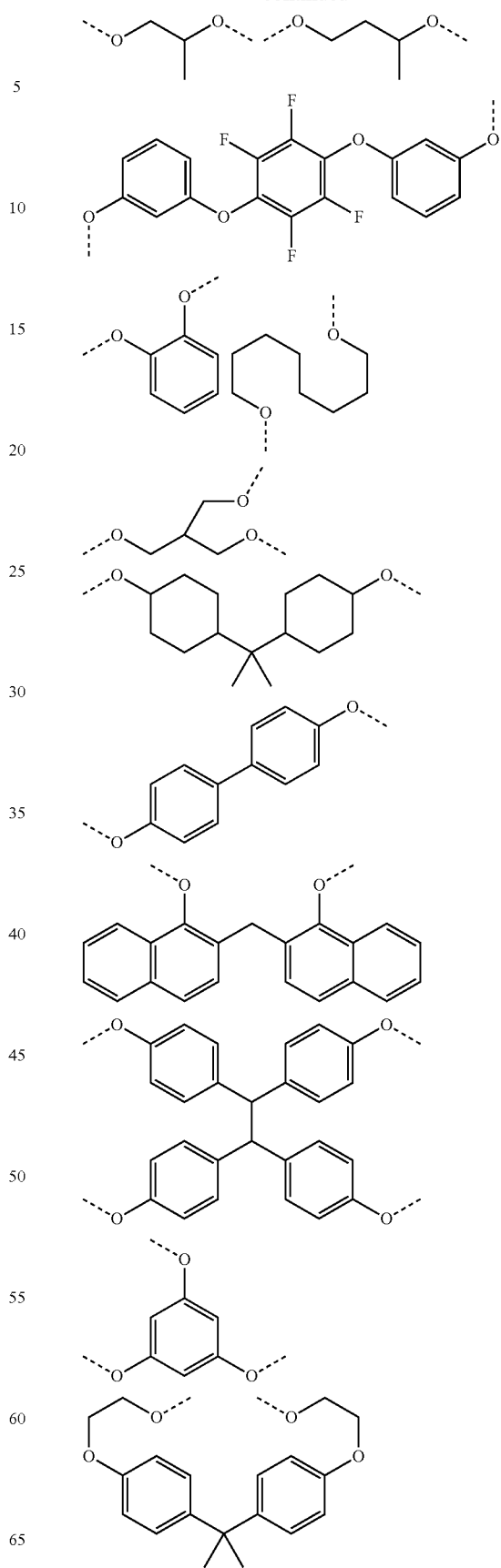

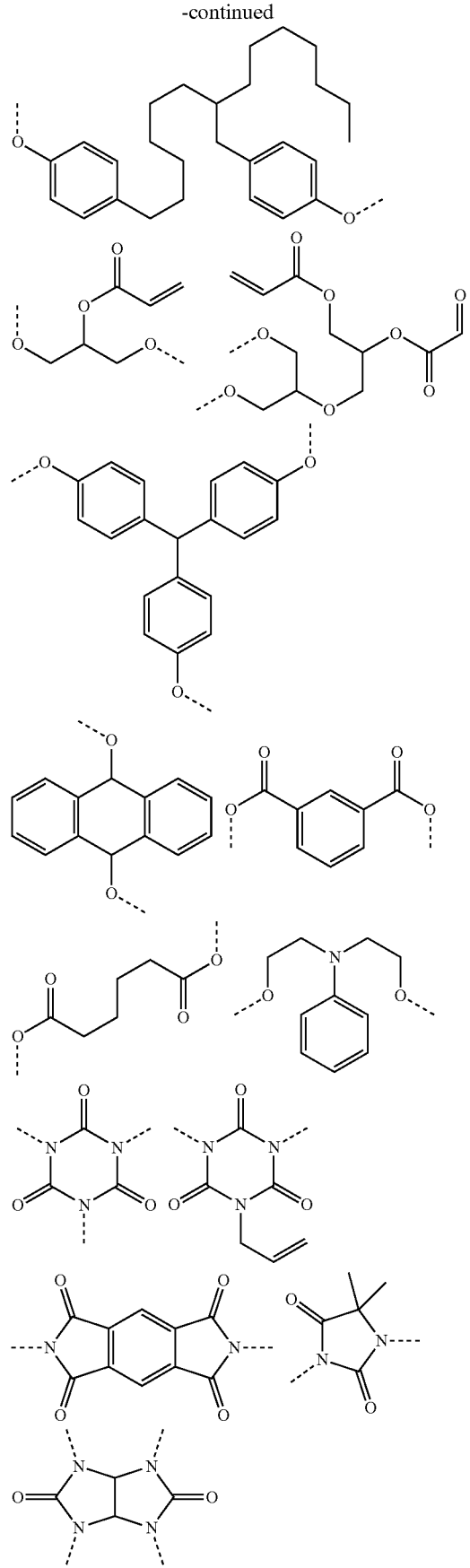
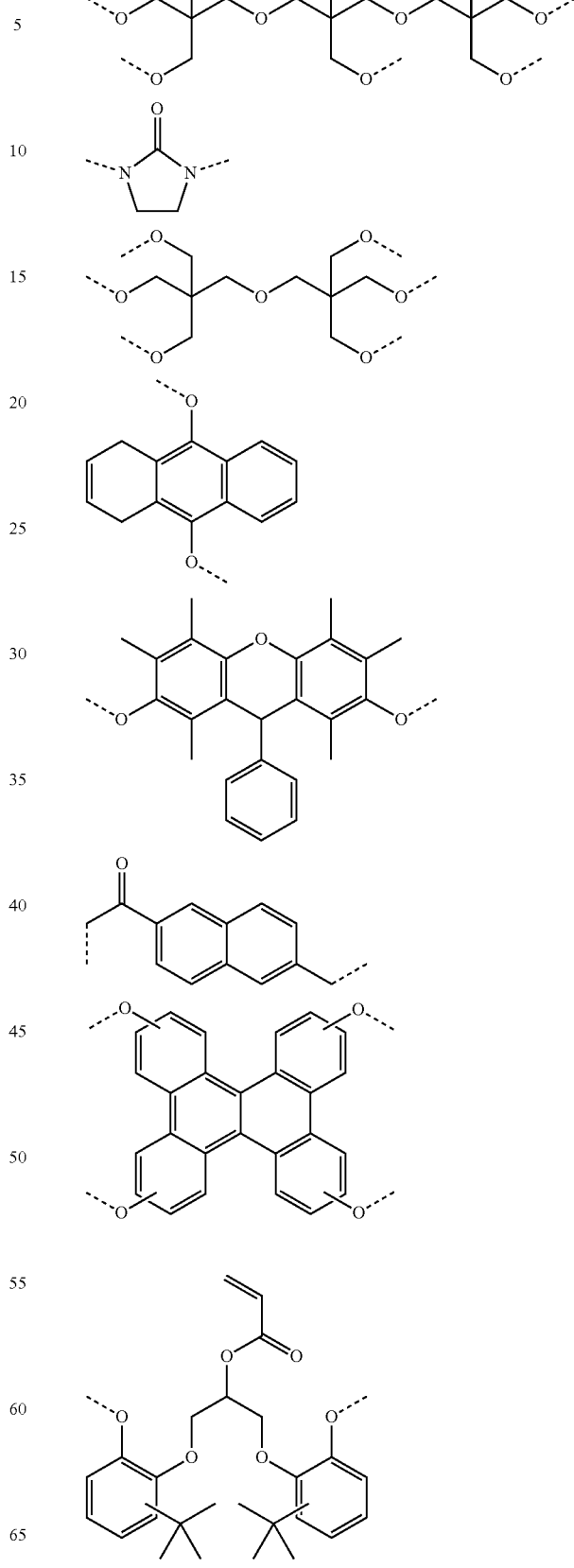

-continued

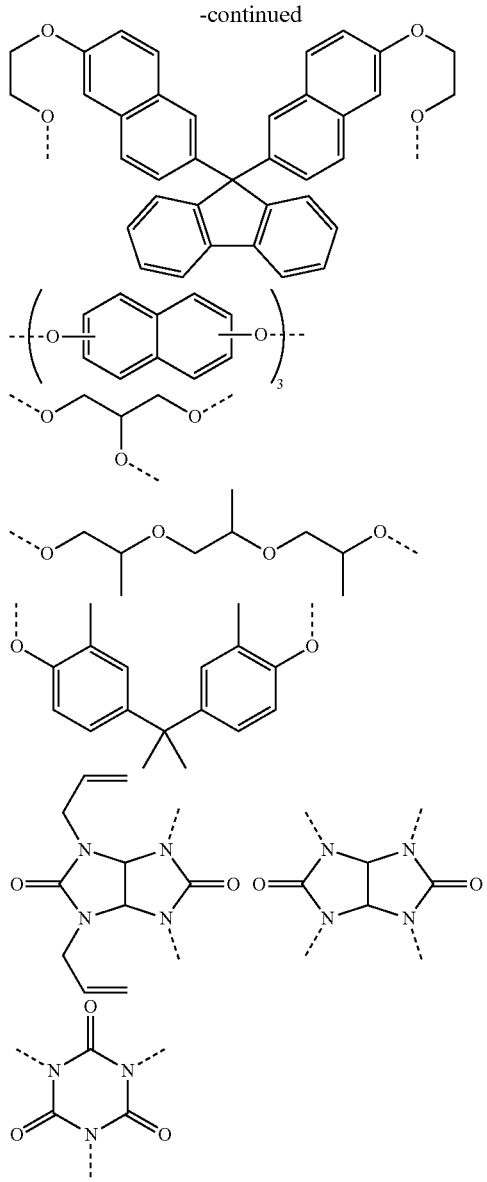

wherein a broken line represents a bonding arm.

Such a resist underlayer film material makes it possible to form a resist underlayer film excellent in film-formability and flatness, and can be manufactured particularly easily.

Furthermore, (B) the organic solvent is preferably a mixture of one or more organic solvents each having a boiling point of lower than 180° C. and one or more organic solvents each having a boiling point of 180° C. or higher.

With such a resist underlayer film material, the flatness of the formed resist underlayer film can be made further favorable regardless of the design of the substrate to be processed such as coarseness and density of a pattern.

In addition, the inventive resist underlayer film material can further comprise one or more of (C) an acid generator, (D) a surfactant, (E) a crosslinking agent, (F) a plasticizer, and (G) a colorant.

In this manner, it is also possible to add to the inventive resist underlayer film material: (C) an acid generator to promote curing; (D) a surfactant to enhance coatability in spin-coating; (E) a crosslinking agent to promote a crosslinking and curing reaction further; (F) a plasticizer to enhance filling and planarizing properties further; and (G) a colorant to adjust light absorption characteristics. It is possible to make fine adjustments to performance according to requirements, for example, film-formability, curability, filling property, and optical characteristics by the presence, absence, or choice of these additives, and this is favorable for practicality.

Furthermore, the present invention provides a patterning process for forming a pattern in a substrate to be processed, comprising the steps of:
  (I-1) applying the above-described resist underlayer film material on the substrate to be processed and then performing a heat treatment to form a resist underlayer film;
  (I-2) forming a resist upper layer film on the resist underlayer film by using a photoresist material;
  (I-3) subjecting the resist upper layer film to pattern exposure and then to development with a developer to form a pattern in the resist upper layer film;
  (I-4) transferring the pattern to the resist underlayer film by dry etching while using the resist upper layer film having the formed pattern as a mask; and
  (I-5) processing the substrate to be processed while using the resist underlayer film having the formed pattern as a mask to form the pattern in the substrate to be processed.

Furthermore, the present invention provides a patterning process for forming a pattern in a substrate to be processed, comprising the steps of:
  (II-1) applying the above-described resist underlayer film material on the substrate to be processed and then performing a heat treatment to form a resist underlayer film;
  (II-2) forming a resist middle layer film on the resist underlayer film;
  (II-3) forming a resist upper layer film on the resist middle layer film by using a photoresist material;
  (II-4) subjecting the resist upper layer film to pattern exposure and then to development with a developer to form a pattern in the resist upper layer film;
  (II-5) transferring the pattern to the resist middle layer film by dry etching while using the resist upper layer film having the formed pattern as a mask;
  (II-6) transferring the pattern to the resist underlayer film by dry etching while using the resist middle layer film having the transferred pattern as a mask; and
  (II-7) processing the substrate to be processed while using the resist underlayer film having the formed pattern as a mask to form the pattern in the substrate to be processed.

Furthermore, the present invention provides a patterning process for forming a pattern in a substrate to be processed, comprising the steps of:
  (III-1) applying the above-described resist underlayer film material on the substrate to be processed and then performing a heat treatment to form a resist underlayer film;
  (III-2) forming an inorganic hard mask middle layer film selected from a silicon oxide film, a silicon nitride film, and a silicon oxynitride film on the resist underlayer film;
  (III-3) forming an organic thin film on the inorganic hard mask middle layer film;
  (III-4) forming a resist upper layer film on the organic thin film by using a photoresist material;

(III-5) subjecting the resist upper layer film to pattern exposure and then to development with a developer to form a pattern in the resist upper layer film;

(III-6) transferring the pattern to the organic thin film and the inorganic hard mask middle layer film by dry etching while using the resist upper layer film having the formed pattern as a mask;

(III-7) transferring the pattern to the resist underlayer film by dry etching while using the inorganic hard mask middle layer film having the transferred pattern as a mask; and (III-8) processing the substrate to be processed while using the resist underlayer film having the formed pattern as a mask to form the pattern in the substrate to be processed.

As described, the inventive resist underlayer film material can be used suitably in various patterning processes such as a 2-layer resist process, a 3-layer resist process using a resist middle layer film, and a 4-layer resist process additionally using an organic thin film. These patterning processes make it possible to relieve unevenness and steps of the substrate to be processed effectively by the formation of the resist underlayer film, and are suitable for photolithography of a resist upper layer film.

Furthermore, in the inventive patterning processes, a substrate having a structure or a step with a height of 30 nm or more can be used as the substrate to be processed.

Since the inventive resist underlayer film material, with which it is possible to form a resist underlayer film having high filling and planarizing properties is used in the inventive patterning processes, the inventive patterning processes are particularly useful for fine processing of a substrate having such a structure or step.

Furthermore, the present invention provides a method for forming a resist underlayer film that functions as an organic flat film employed in a semiconductor device manufacturing process, the method comprising:

spin-coating a substrate to be processed with the above-described resist underlayer film material; and heating the substrate coated with the resist underlayer film material at a temperature of 100° C. or higher to 600° C. or lower for 10 to 600 seconds to form a cured film.

Furthermore, the present invention provides a method for forming a resist underlayer film that functions as an organic flat film employed in a semiconductor device manufacturing process, the method comprising:

spin-coating a substrate to be processed with the above-described resist underlayer film material; and heating the substrate coated with the resist underlayer film material in an atmosphere having an oxygen concentration of 1% or more to 21% or less to form a cured film.

According to such a method, it is possible to promote a crosslinking reaction when forming the resist underlayer film and to suppress mixing with the upper layer film at a higher degree. In addition, by appropriately adjusting the heating temperature, time, and oxygen concentration within the above ranges, it is possible to achieve the filling and planarizing properties and curing property of the resist underlayer film suitable for the usage.

Furthermore, the present invention provides a method for forming a resist underlayer film that functions as an organic flat film employed in a semiconductor device manufacturing process, the method comprising:

spin-coating a substrate to be processed with the above-described resist underlayer film material; and heating the substrate coated with the resist underlayer film material in an atmosphere having an oxygen concentration of less than 1% to form a cured film.

Such a method is useful since it is possible to promote the crosslinking reaction when forming the resist underlayer film and to suppress mixing with the upper layer film at a higher degree without causing degradation of the substrate to be processed even when the substrate to be processed contains a material that is unstable to heating under an oxygen atmosphere.

In this event, a substrate having a structure or a step with a height of 30 nm or more can be used as the substrate to be processed.

Since the inventive resist underlayer film material, with which it is possible to form a resist underlayer film having high filling and planarizing properties is used in the inventive methods for forming a resist underlayer film, the inventive methods are particularly suitable for forming a resist underlayer film on a substrate having such a structure or step.

Advantageous Effects of Invention

As described above, the inventive resist underlayer film material, patterning process, and method for forming a resist underlayer film are particularly suitably used in a multilayer resist process including the planarization of a stepped or uneven substrate to be processed, and are extremely useful in fine patterning for manufacturing a semiconductor device. In particular, it is possible to provide: a resist underlayer film material in a fine patterning process by a multilayer resist method in a semiconductor device manufacturing process, where the resist underlayer film material makes it possible to form a resist underlayer film that is excellent in flatness and that can be formed without substrate dependency even on a substrate to be processed having portions that are particularly difficult to planarize such as a wide trench structure, and the material further has an appropriate etching property and optical characteristics; a patterning process in which the material is used; and a method for forming a resist underlayer film.

BRIEF DESCRIPTION OF DRAWINGS

FIG. 1 is an explanatory diagram of an example of an inventive patterning process according to a 3-layer resist process.

FIG. 2 is an explanatory diagram of a method for evaluating the filling property in Examples.

FIG. 3 is an explanatory diagram of a method for evaluating the planarizing property in Examples.

DESCRIPTION OF EMBODIMENTS

As described above, the following have been desired: a resist underlayer film material in a fine patterning process by a multilayer resist method in a semiconductor device manufacturing process, where the resist underlayer film material makes it possible to form a resist underlayer film excellent in film-formability and flatness even on a substrate to be processed having portions that are particularly difficult to planarize such as a wide trench structure, and the material further has excellent filling property and an appropriate etching property and optical characteristics; a patterning process in which the material is used; and a method for forming a resist underlayer film.

The present inventors have investigated various resist underlayer film materials and patterning processes in order to realize high filling and planarization by forming an underlayer film and excellent film-formability in multilayer lithography that uses a resist underlayer film. As a result, the present inventors have found out that a resist underlayer film material having, as a main component, a compound having a combination of certain terminal structures, a patterning process using the material, and a method for forming a resist underlayer film are extremely effective, and completed the present invention.

That is, the present invention is a resist underlayer film material for use in a multilayer resist method, comprising:
(A) one or more compounds shown by the following general formula (1); and
(B) an organic solvent,

wherein W represents an organic group with a valency of "n" having 2 to 50 carbon atoms; X represents either of terminal group structures shown by the following general formula (2) and the following general formula (3); when a ratio of the structure of the following general formula (2) to the structure of the following general formula (3) each constituting the X is "a" to "b", "a" and "b" satisfy the relations a+b=1.0, 0.70≤a≤0.99, and 0.01≤b≤0.30; and "n" represents an integer of 1 to 10,

wherein a broken line represents a bonding arm; Z represents an aromatic group with a valency of (k+1) having 6 to 20 carbon atoms; A represents a single bond or —O—(CH$_2$)$_p$—; "k" represents an integer of 1 to 5; and "p" represents an integer of 1 to 10,

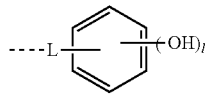

wherein a broken line represents a bonding arm; L represents a single bond or —(CH$_2$)$_r$—; "l" represents 2 or 3; and "r" represents an integer of 1 to 5.

Hereinafter, the present invention will be described in detail, but the present invention is not limited thereto.

<Resist Underlayer Film Material>

The inventive resist underlayer film material is, as described above, a resist underlayer film material for use in a multilayer resist method, containing:
(A) one or more compounds shown by the following general formula (1); and
(B) an organic solvent.

In the formula, W represents an organic group with a valency of "n" having 2 to 50 carbon atoms; X represents either of terminal group structures shown by the following general formula (2) and the following general formula (3); when a ratio of the structure of the following general formula (2) to the structure of the following general formula (3) each constituting the X is "a" to "b", "a" and "b" satisfy the relations a+b=1.0, 0.70≤a≤0.99, and 0.01≤b≤0.30; and "n" represents an integer of 1 to 10.

In the formula, a broken line represents a bonding arm; Z represents an aromatic group with a valency of (k+1) having 6 to 20 carbon atoms; A represents a single bond or —O—(CH$_2$)$_p$—; "k" represents an integer of 1 to 5; and "p" represents an integer of 1 to 10.

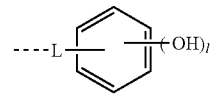

In the formula, a broken line represents a bonding arm; L represents a single bond or —(CH$_2$)$_r$—; "l" represents 2 or 3; and "r" represents an integer of 1 to 5.

[(A) One or More Compounds Shown by General Formula (1)]

The inventive resist underlayer film material is excellent in flowability and affinity with a substrate since the material contains the compound shown by the general formula (1). Thus, it can be considered that it is possible to form a resist underlayer film which is excellent in flatness even on a substrate to be processed having portions that are particularly difficult to planarize such as a wide trench structure, and which has excellent film-formability even on a substrate to be processed having a fine complex structure or various surface qualities.

In the general formula (2), a broken line represents a bonding arm. Z represents an aromatic group with a valency of (k+1) having 6 to 20 carbon atoms. Z represents a group with a valency of (k+1) having a structure in which (k+1) hydrogen atoms have been removed from an aromatic compound having 6 to 20 carbon atoms. Examples of the aromatic compound having 6 to 20 carbon atoms in this event include benzene, naphthalene, phenanthrene, anthracene, pyrene, biphenyl, toluene, xylene, methylnaphthalene, fluorene, etc. In view of providing thermal flowability and availability of raw materials, benzene and naphthalene are preferable. "k" represents an integer of 1 to 5, and to achieve favorable flatness, "k" is preferably 1 to 3. "A" represents a single bond or —O—(CH$_2$)$_p$—, and "p" represents an integer of 1 to 10. To achieve favorable flatness, —OCH$_2$— is preferable, "p" being 1.

Examples of preferable structures of the general formula (2) include the following.

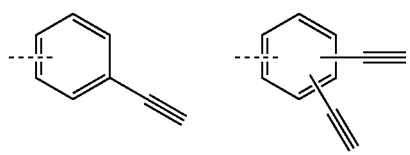

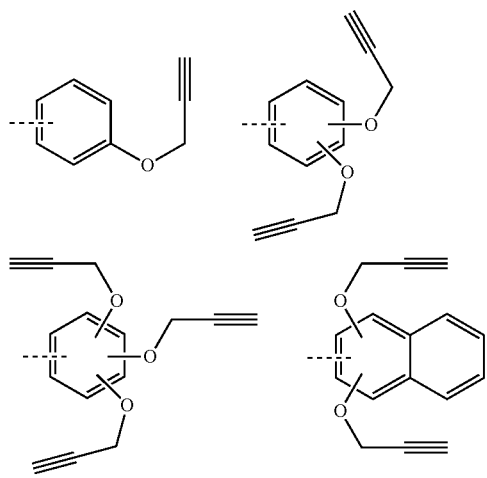

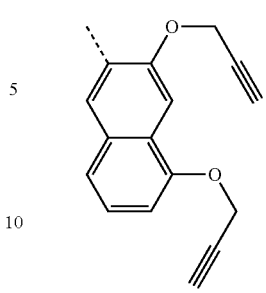

Examples of particularly preferable structures of the general formula (2) include the following formulae (4) to (6).

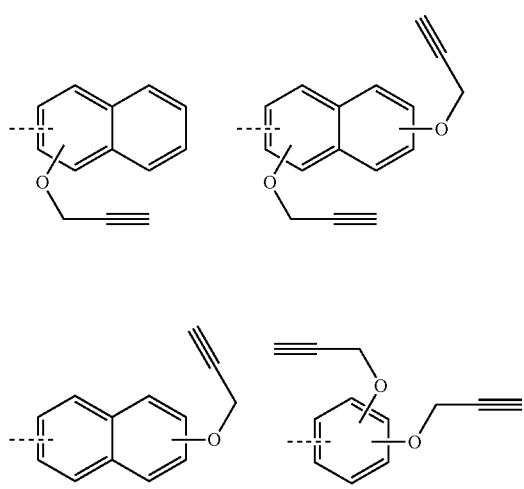

In the inventive resist underlayer film material, the terminal group structure of the general formula (2) functions as a thermosetting group. When substituent A satisfies the relation p=1 and is in a beta position of the naphthalene as in the formulae (4) to (6) given as examples of particularly preferable structures, a mechanism is assumed in which thermosetting takes place via a ring structure as shown in the following reaction formula. In this case, the substituent contributes as a substituent that provides thermal flowability before curing, but during curing, the curing reaction is caused via a rigid ring structure. Therefore, it becomes possible to achieve both thermal flowability and heat resistance, which are conflicting characteristics.

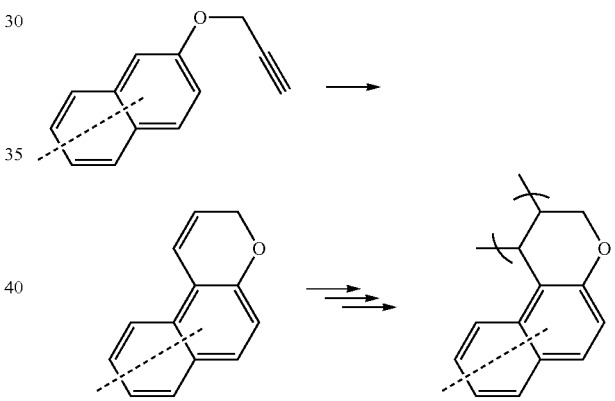

In the general formula (3), a broken line represents a bonding arm. L represents a single bond or —(CH$_2$)$_r$—, and a single bond or r=1 is preferable. "l" represents 2 or 3, and in view of providing adhesiveness, "l" is preferably 2.

Examples of preferable structures of the general formula (3) include the following.

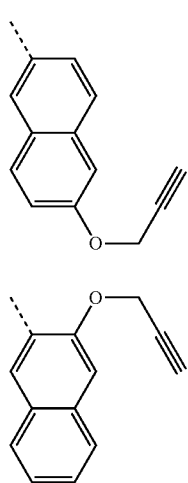

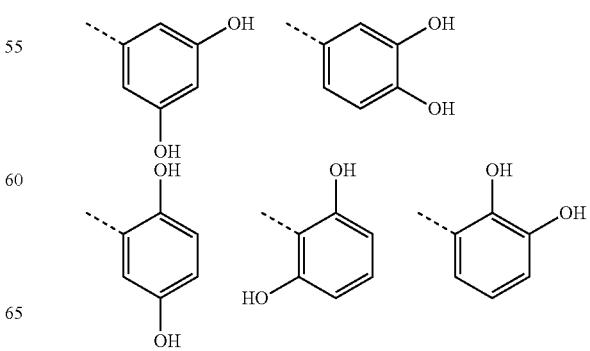

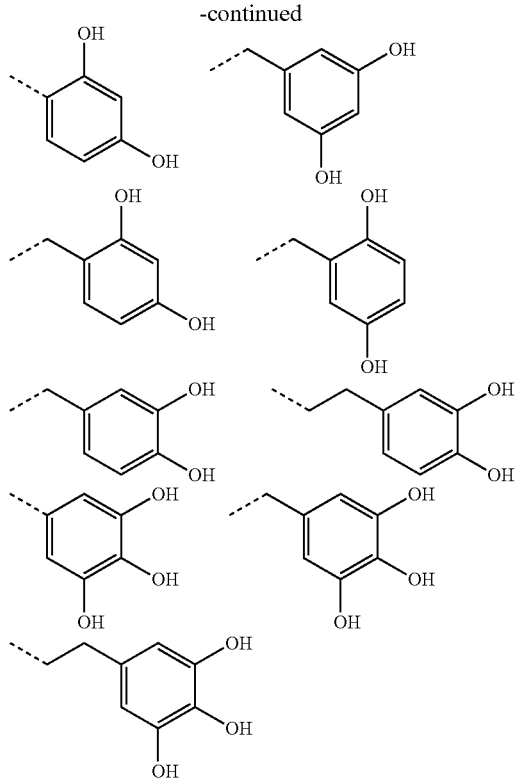

Examples of particularly preferable structures of the general formula (3) include the following formulae (7) and (8).

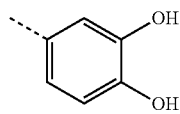
(7)

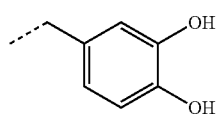
(8)

In the inventive resist underlayer film material, the terminal group structure of the general formula (3) functions as an adhesion group and a film formation auxiliary group. When the catechol-type terminal structures of the formulae (7) and (8) given as examples of particularly preferable structures are contained, favorable flatness is exhibited by the improvement of affinity with a substrate. In addition, adhesiveness to a substrate is enhanced, so that uneven coating of a film that occurs during film formation and delamination from the substrate can be prevented.

Furthermore, when the ratio of the terminal group structure of the general formula (2) to the terminal group structure of the general formula (3) each constituting the terminal group X in the general formula (1) is "a" to "b", "a" and "b" need to satisfy the relations a+b=1.0, 0.70≤a≤0.99, and 0.01≤b≤0.30 (if a+b=100, then 70≤a≤99, 1 b≤30). More preferably, 0.75≤a≤0.97, 0.03≤b≤0.25, further preferably, 0.80≤a≤0.95, 0.05≤b≤0.20. Unless the terminal ratio is adjusted within the above ranges, flatness and film-formability cannot be both achieved while maintaining thermo- setting property. The ratio of the terminal groups can be calculated by 1H NMR as "terminal group containing a triple bond/terminal group containing a phenolic hydroxy group".

In the general formula (1), W represents an organic group with a valency of "n" having 2 to 50 carbon atoms, and W represents an organic group with a valency of 1 to 10 having a structure obtained by removing 1 to 10 hydrogen atoms from an organic compound having 2 to 50 carbon atoms. A compound having the organic group W having 2 to 50 carbon atoms having a structure in which 1 to 10 hydrogen atoms are added to the W has at least one each of the terminal structures shown by the general formulae (2) and (3). In addition, the organic group represented by W may contain a linear, branched, or cyclic saturated or unsaturated hydrocarbon group, aromatic group, hetero-aromatic group, ether group, hydroxy group, ester group, keto group, amino group, halogen group, sulfide group, carboxy group, sulfo group, imide group, cyano group, aldehyde group, imino group, urea group, carbamate group, carbonate group, nitro group, sulfone group, or the like. To achieve both favorable flatness and sufficient thermosetting property, "n" is more preferably 2 to 4.

Properties of the resist underlayer film material such as etching resistance, heat resistance, optical characteristics, polarity, and flexibility can be adjusted by selecting the W, X, and "n" in the compound of the general formula (1) appropriately according to the usage. Among these, with regard to optical characteristics, when the resist underlayer film material has suitable optical characteristics at a wavelength of 193 nm, reflected light during exposure in multilayer ArF lithography can be suppressed, and excellent resolution can be achieved. Note that to suppress reflected light, optical constants of the resist underlayer film material are preferably roughly: a refractive index "n" of 1.4 to 1.9; and an extinction coefficient "k" of 0.1 to 0.5.

Furthermore, W in the general formula (1) is preferably a structure shown by the following general formula (9).

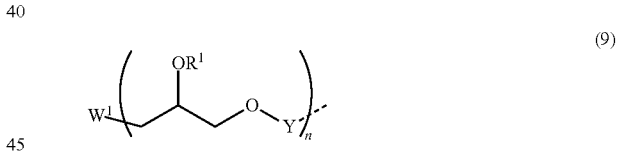
(9)

In the formula, a broken line represents a bonding arm. $R^1$ represents a hydrogen atom or an alkyl group or an acyl group having 1 to 20 carbon atoms and optionally having an oxygen atom or a nitrogen atom. $W^1$ represents an organic group with a valency of "n" having 1 to 47 carbon atoms. Y represents a single bond or a carbonyl group. "n" represents an integer of 1 to 10.

When W in the general formula has a partial structure shown by the general formula (9), the affinity between the inventive resist underlayer film material and the substrate to be processed increases, and thermal flowability is also provided. Thus, favorable flatness can be provided.

Examples of $R^1$ in the general formula (9) include a hydrogen atom, a methyl group, a methoxymethyl group, a 1-ethoxyethyl group, a 1-(2-ethylhexyloxy)ethyl group, a 2-tetrahydropyranyl group, an allyl group, a benzyl group, a propargyl group, a formyl group, an acetyl group, a propionyl group, a butyryl group, a hexanoyl group, an icosanoyl group, an acryloyl group, a methacryloyl group, a propioloyl group, a methoxyacetyl group, a benzoyl group, a 4-acetamidobenzoyl group, a carbamoyl group, an N-methylcarbamoyl group, an N,N-dimethylcarbamoyl group, and the like. In particular, a hydrogen atom, an acetyl group, and an acryloyl group are preferable, and a hydrogen atom is particularly preferable.

In the general formula (9), Y represents a single bond or a carbonyl group, and Y is more preferably a carbonyl group.

$W^1$ in the general formula (9) represents an organic group with a valency of "n" having 1 to 47 carbon atoms. The organic group of $W^1$ having 1 to 47 carbon atoms may contain a linear, branched, or cyclic saturated or unsaturated hydrocarbon group, aromatic group, hetero-aromatic group, ether group, hydroxy group, ester group, keto group, amino group, halogen group, sulfide group, carboxy group, sulfo group, imide group, cyano group, aldehyde group, imino group, urea group, carbamate group, carbonate group, nitro group, or sulfone group. "n" represents an integer of 1 to 10, and to achieve both favorable flatness and sufficient thermosetting property, "n" is more preferably 2 to 4.

Preferable examples of $W^1$ in the general formula (9) include the structures of the following formulae and the like.

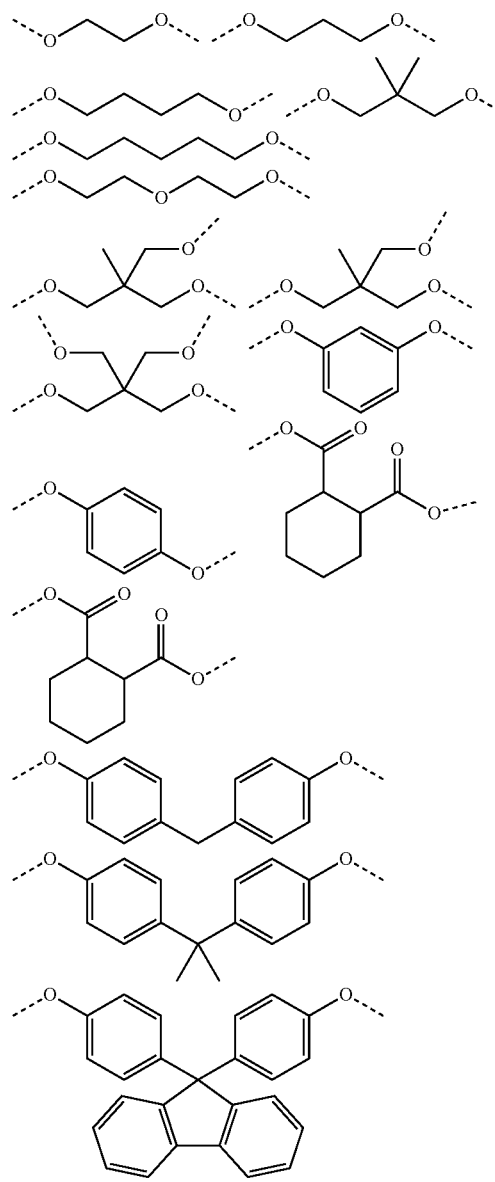

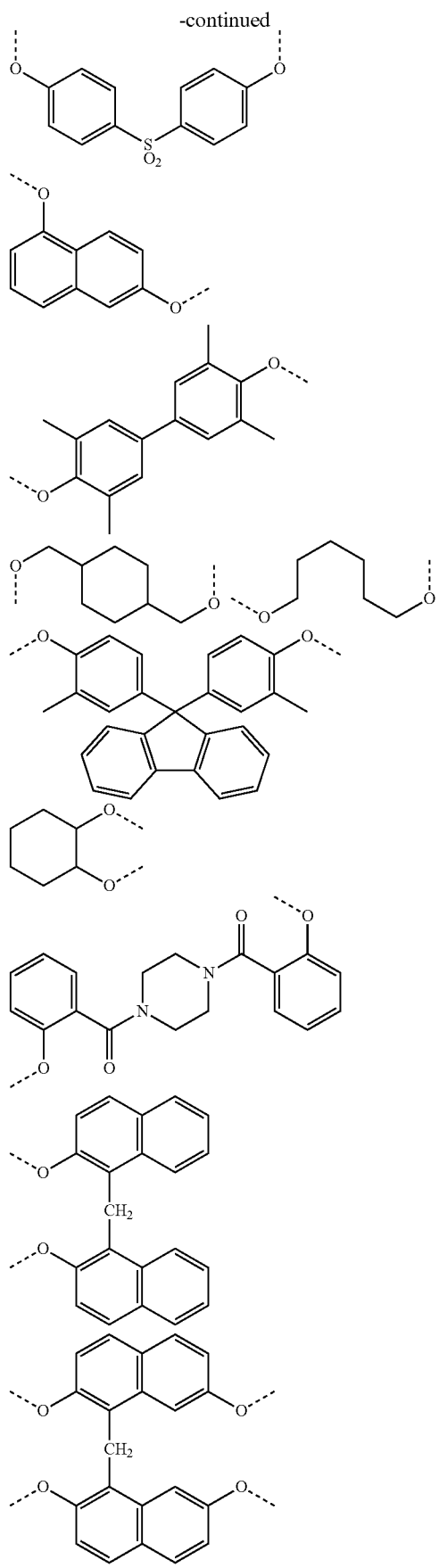

-continued
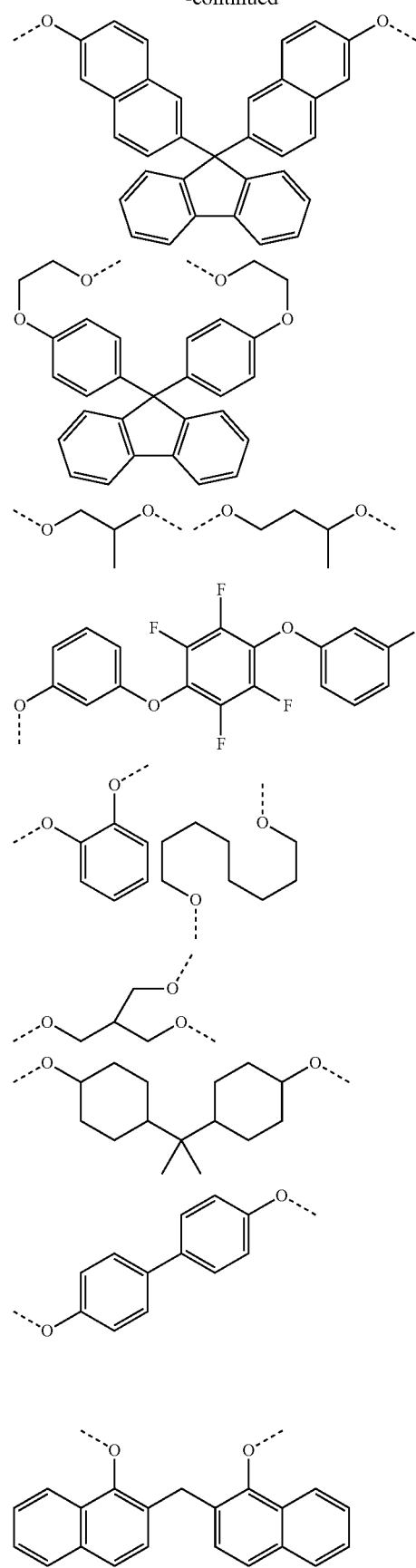
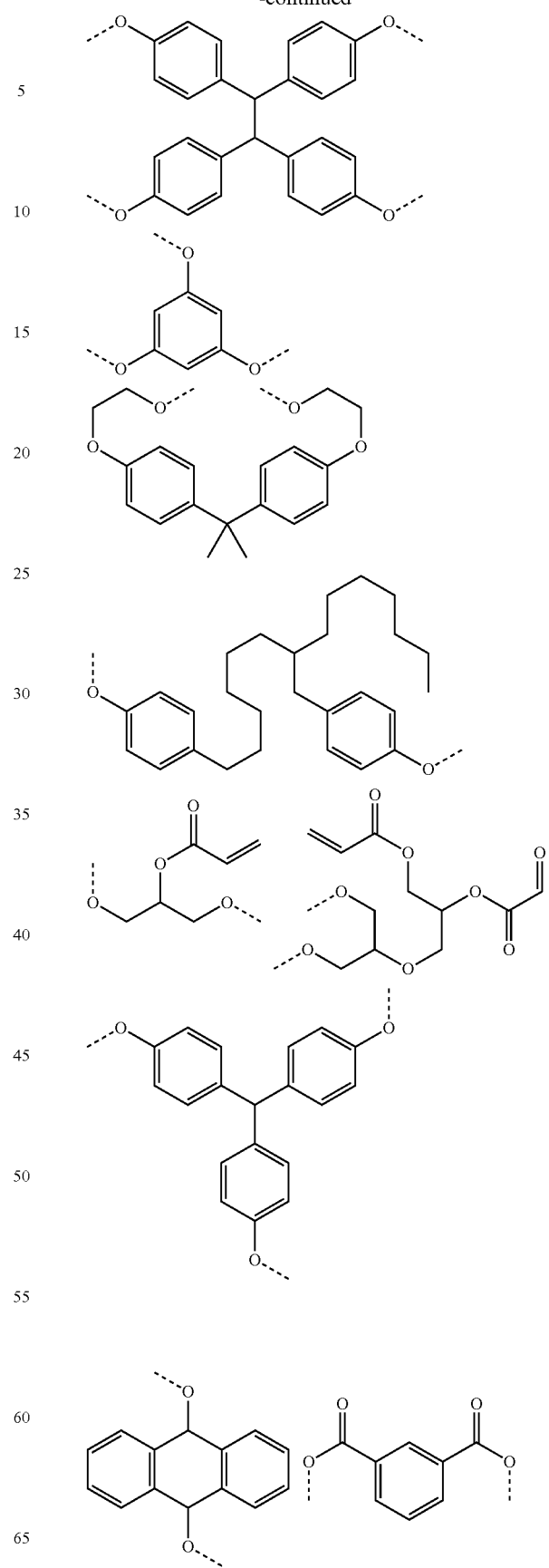

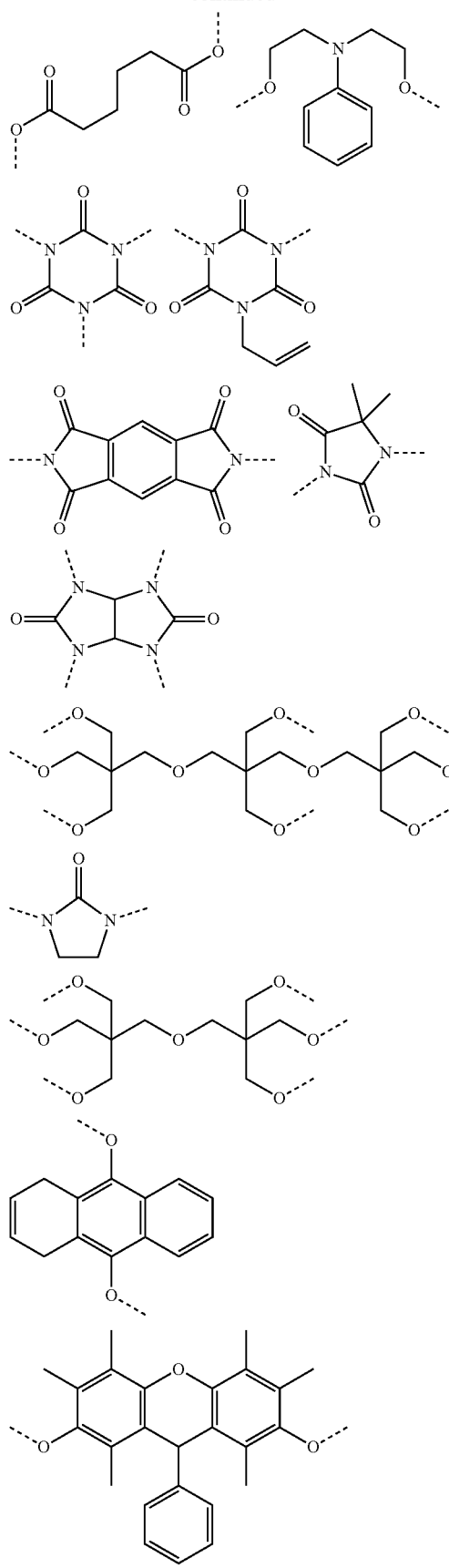
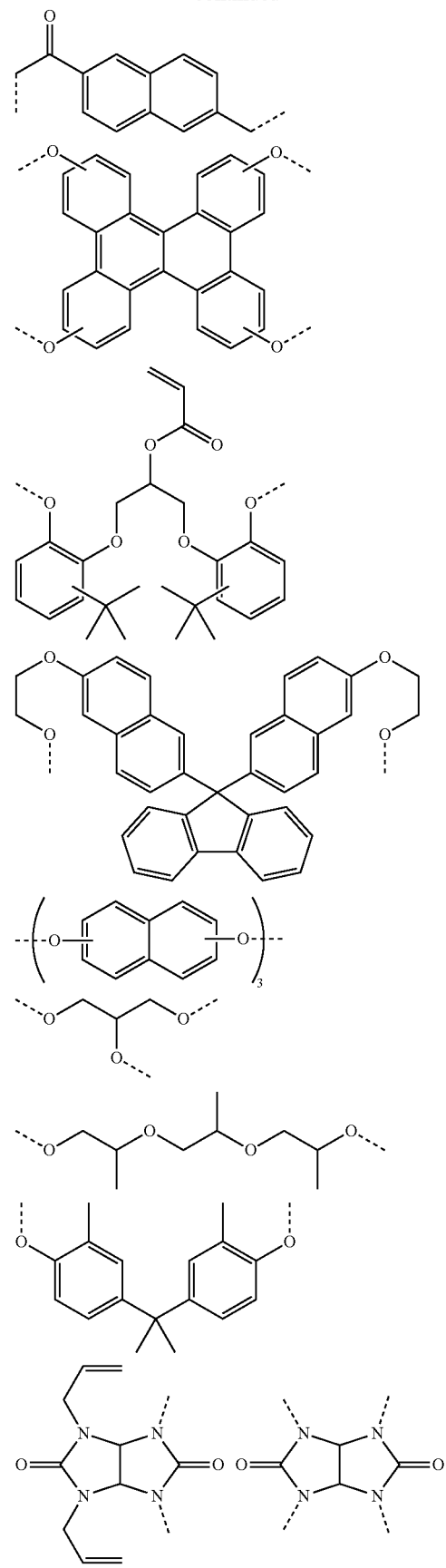

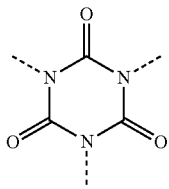

In the formulae, a broken line represents a bonding arm.

Properties such as etching resistance, heat resistance, optical constants, polarity, flexibility, and curability can be adjusted by selecting $R^1$, $W^1$, Y, and "n" appropriately in accordance with the required performance of the present invention and usage.

In the present invention, one of the compound of the general formula (1) may be used, or a mixture of two or more thereof may be used. The compound may also be used as a mixture containing the compound shown by the general formula (1). When used as a mixture, the compound shown by the general formula (1) preferably takes up 10 mass % or more, more preferably 20 mass % or more of all solid contents excluding the solvent of the resist underlayer film material. With 10 mass % or more, a sufficient blending effect can be achieved. The compound of the general formula (1) preferably has a formula weight of 300 to 3,000, particularly preferably 500 to 2,500. When the molecular weight is 300 or more, film-formability becomes excellent, and contamination of equipment due to an increase in sublimation product during curing does not occur. When the molecular weight is 3,000 or less, planarizing and filling properties become excellent. Note that in the present invention, the molecular weight can be defined as a weight-average molecular weight (Mw) measured by gel permeation chromatography (GPC) using tetrahydrofuran as an eluent in terms of polystyrene.

Such a resist underlayer film material makes it possible to form a resist underlayer film excellent in flatness, and can be manufactured particularly easily.

In addition to the compound shown by the general formula (1), other substances can also be blended in the inventive resist underlayer film material. The substances for blending are mixed with the compound shown by the general formula (1), and have a function of enhancing film-formability in spin-coating or filling property in a substrate having steps. Substances that may be mixed in such a case are not particularly limited, and known substances can be used. Specifically, an acrylic resin, a styrene resin, a phenolic resin, a polyether resin, an epoxy resin, and a compound having a phenolic hydroxy group are preferable. The substances for blending are preferably blended in an amount of 1 to 100 parts by mass, more preferably 2 to 50 parts by mass based on 100 parts by mass of the compound shown by the general formula (1).

[(B) Organic Solvent]

There are no particular restrictions to (B) the organic solvent that can be used in the inventive resist underlayer film material as long as the organic solvent can dissolve (A) the one or more compounds shown by the general formula (1). An organic solvent that can also dissolve (C) the acid generator, (D) the surfactant, (E) the crosslinking agent, (F) the plasticizer, and (G) the colorant described below is preferable.

Specifically, solvents disclosed in paragraphs [0091] to (0092) of JP 2007-199653 A can be added. Further specifically, propylene glycol monomethyl ether acetate, propylene glycol monomethyl ether, propylene glycol monoethyl ether, propylene glycol monopropyl ether, 2-heptanone, cyclopentanone, cyclohexanone, γ-butyrolactone, or a mixture containing one or more thereof is preferably used.

The amount of the organic solvent to be blended is preferably adjusted in accordance with the set film thickness of the resist underlayer film, but is usually 100 to 50,000 parts by mass based on 100 parts by mass of the compound of the general formula (1).

Furthermore, in the inventive resist underlayer film material, (B) the organic solvent is preferably a mixture of one or more organic solvents each having a boiling point of lower than 180° C. and one or more organic solvents each having a boiling point of 180° C. or higher (hereinafter, also referred to as a "high-boiling-point solvent").

Specific examples of the organic solvent having a boiling point of lower than 180° C. include propylene glycol monomethyl ether acetate, propylene glycol monomethyl ether, propylene glycol monoethyl ether, propylene glycol monopropyl ether, 2-heptanone, cyclopentanone, and cyclohexanone.

The organic solvent having a boiling point of 180° C. or higher is not particularly limited to hydrocarbons, alcohols, ketones, esters, ethers, chlorinated solvents, and so forth, as long as the organic solvent is capable of dissolving each component in the inventive resist underlayer film material. Specific examples include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, methyl benzoate, ethyl benzoate, propyl benzoate, butyl benzoate, dihexyl malonate, diethyl succinate, dipropyl succinate, dibutyl succinate, dihexyl succinate, dimethyl adipate, diethyl adipate, dibutyl adipate, and the like. One of these may be used or a mixture thereof may be used.

The organic solvent having a boiling point of 180° C. or higher can be appropriately selected from those given above, for example, in accordance with the temperature at which the inventive resist underlayer film material is heated, etc. The boiling point of the organic solvent having a boiling point of 180° C. or higher is preferably 180° C. to 300° C., further preferably 200° C. to 300° C. It can be considered that with such a boiling point, there is no risk of the evaporation rate at baking (heating) from becoming excessive, which would otherwise occur if the boiling point is too low. Thus, such a boiling point can provide sufficient thermal flowability during film formation, and a resist underlayer film excellent in filling and planarizing properties can be formed. Meanwhile, with such a boiling point, the boiling point is not too high, so that the organic solvent evaporates after baking and does not remain in the film; thus, the boiling point of 300° C. or lower does not adversely affect the film physical properties such as etching resistance.

When the organic solvent having a boiling point of 180° C. or higher is used, the blended amount is preferably 1 to 30 parts by mass based on 100 parts by mass of the organic solvent having a boiling point of lower than 180° C. Such an amount prevents a failure in providing sufficient thermal flowability during baking, which would otherwise occur if the blended amount is too small. In addition, degradation of the film physical properties such as etching resistance is prevented, which would otherwise occur if the blended amount is so large that the solvent remains in the film. Thus, such an amount is preferable.

[(C) Acid Generator]

In the inventive resist underlayer film material, (C) an acid generator can be added so as to further promote the curing reaction. The acid generator includes a material that generates an acid by thermal decomposition, and a material that generates an acid by light irradiation. Any acid generator can be added. Specifically, materials disclosed in paragraphs [0061] to [0085] of JP 2007-199653 A can be added, but the present invention is not limited thereto.

One of the acid generators can be used, or a combination of two or more thereof can be used. When the acid generator is added, the added amount is preferably 0.05 to 50 parts by mass, more preferably 0.1 to 10 parts by mass based on 100 parts by mass of the compound shown by the general formula (1).

[(D) Surfactant]

To the inventive resist underlayer film material, (D) a surfactant can be added so as to enhance the coating property in spin-coating. As examples of the surfactant, those disclosed in [0142] to (01471 of JP 2009-269953 A can be used. When the surfactant is added, the added amount is preferably 0.001 to 20 parts by mass, more preferably 0.01 to 10 parts by mass based on 100 parts by mass of the compound shown by the general formula (1).

[(E) Crosslinking Agent]

Moreover, to the inventive resist underlayer film material, (E) a crosslinking agent can also be added so as to increase the curability and to further suppress intermixing with an upper layer film. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, epoxy-based crosslinking agents, and phenol-based crosslinking agents (e.g. methylol or alkoxymethyl-type crosslinking agents of polynuclear phenols). When the crosslinking agent is added, the added amount is preferably 1 to 50 parts by mass, more preferably 10 to 40 parts by mass based on 100 parts by mass of the compound shown by the general formula (1).

Specific examples of the melamine-based crosslinking agents include hexamethoxymethylated melamine, hexabutoxymethylated melamine, alkoxy- and/or hydroxy-substituted derivatives thereof, and partial self-condensates thereof.

Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof.

Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof.

Specific examples of the urea-based crosslinking agents include dimethoxymethylated dimethoxyethyleneurea, alkoxy- and/or hydroxy-substituted derivatives thereof, and partial self-condensates thereof.

A specific example of the β-hydroxyalkylamide-based crosslinking agents includes N,N,N',N'-tetra(2-hydroxyethyl)adipic acid amide.

Specific examples of the isocyanurate-based crosslinking agents include triglycidyl isocyanurate and triallyl isocyanurate.

Specific examples of the aziridine-based crosslinking agents include 4,4'-bis(ethyleneiminocarbonylamino)diphenylmethane and 2,2-bishydroxymethylbutanol-tris[3-(1-aziridinyl)propionate].

Specific examples of the oxazoline-based crosslinking agents include 2,2'-isopropylidene bis(4-benzyl-2-oxazoline), 2,2'-isopropylidene bis(4-phenyl-2-oxazoline), 2,2'-methylenebis-4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer.

Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Specific examples of the polynuclear-phenol-based crosslinking agents include compounds shown by the following general formula (10).

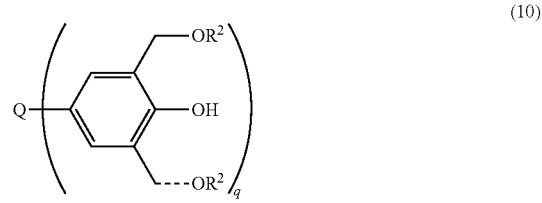

(10)

In the formula, Q represents a single bond or a hydrocarbon group with a valency of "q" having 1 to 20 carbon atoms. $R^2$ represents a hydrogen atom or an alkyl group having 1 to 20 carbon atoms. "q" represents an integer of 1 to 5.

Q represents a single bond or a hydrocarbon group with a valency of "q" having 1 to 20 carbon atoms. "q" represents an integer of 1 to 5, more preferably 2 or 3. Specific examples of Q include groups obtained by removing "q"

hydrogen atoms from methane, ethane, propane, butane, isobutane, pentane, cyclopentane, hexane, cyclohexane, methyl pentane, methyl cyclohexane, dimethyl cyclohexane, trimethyl cyclohexane, benzene, toluene, xylene, ethyl benzene, ethyl isopropylbenzene, diisopropylbenzene, methylnaphthalene, ethyl naphthalene, and eicosane. $R^2$ represents a hydrogen atom or an alkyl group having 1 to 20 carbon atoms. Specific examples of the alkyl group having 1 to 20 carbon atoms include a methyl group, an ethyl group, a propyl group, an isopropyl group, a butyl group, an isobutyl group, a pentyl group, an isopentyl group, a hexyl group, an octyl group, an ethylhexyl group, a decyl group, and an eicosanyl group. A hydrogen atom or a methyl group is preferable.

Specific examples of the compound shown by the general formula (10) include the following compounds. In particular, in view of enhancing the curability and film thickness uniformity of the resist underlayer film, hexamethoxymethylated compounds of triphenolmethane, triphenolethane, 1,1,1-tris(4-hydroxyphenyl)ethane, and tris(4-hydroxyphenyl)-1-ethyl-4-isopropylbenzene are preferable.

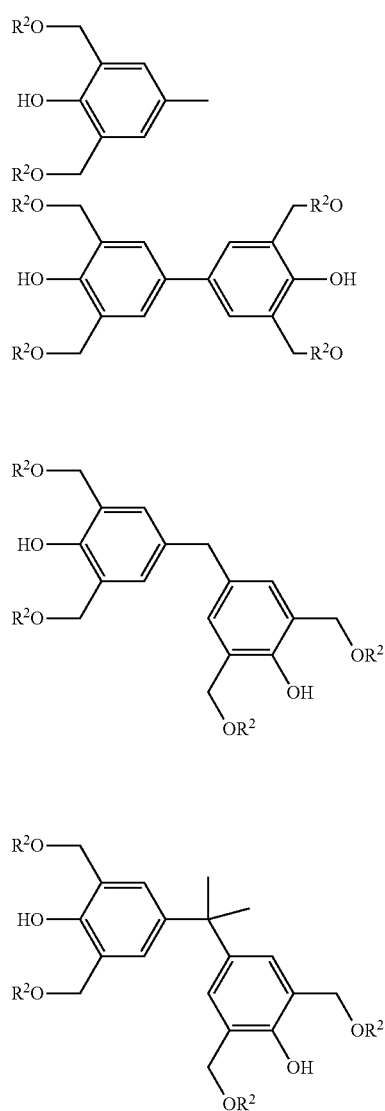

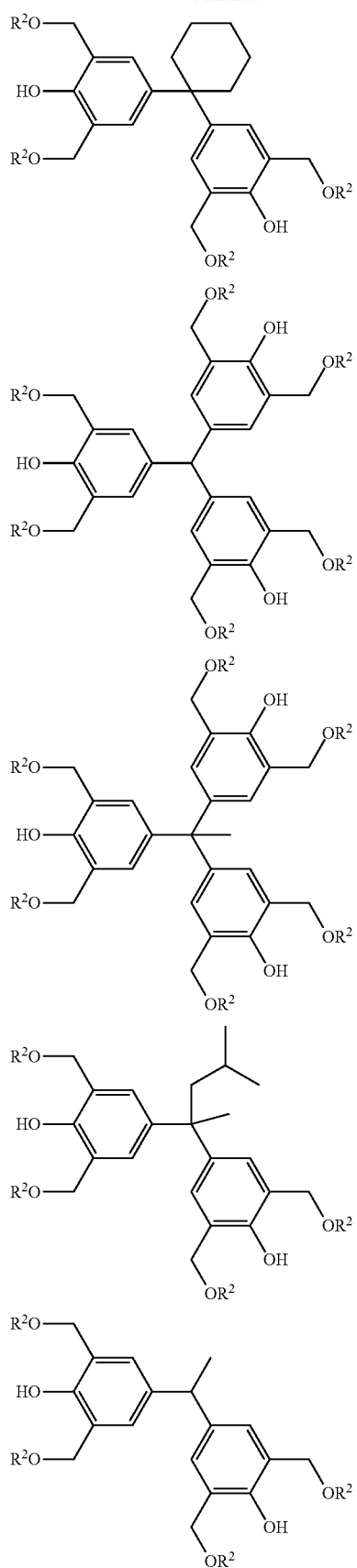

33
-continued
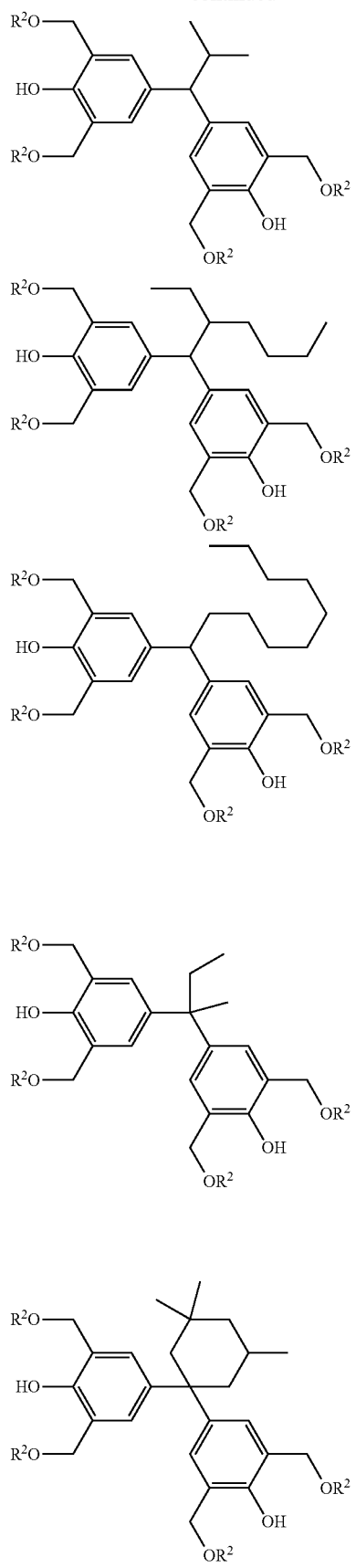
34
-continued
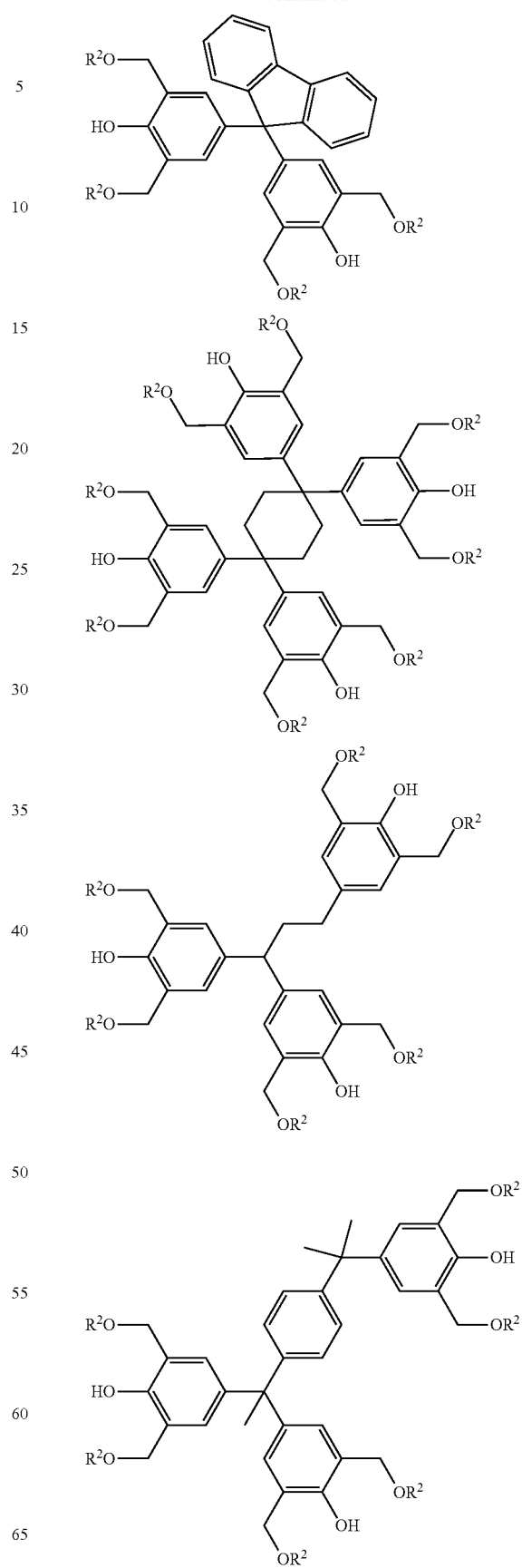

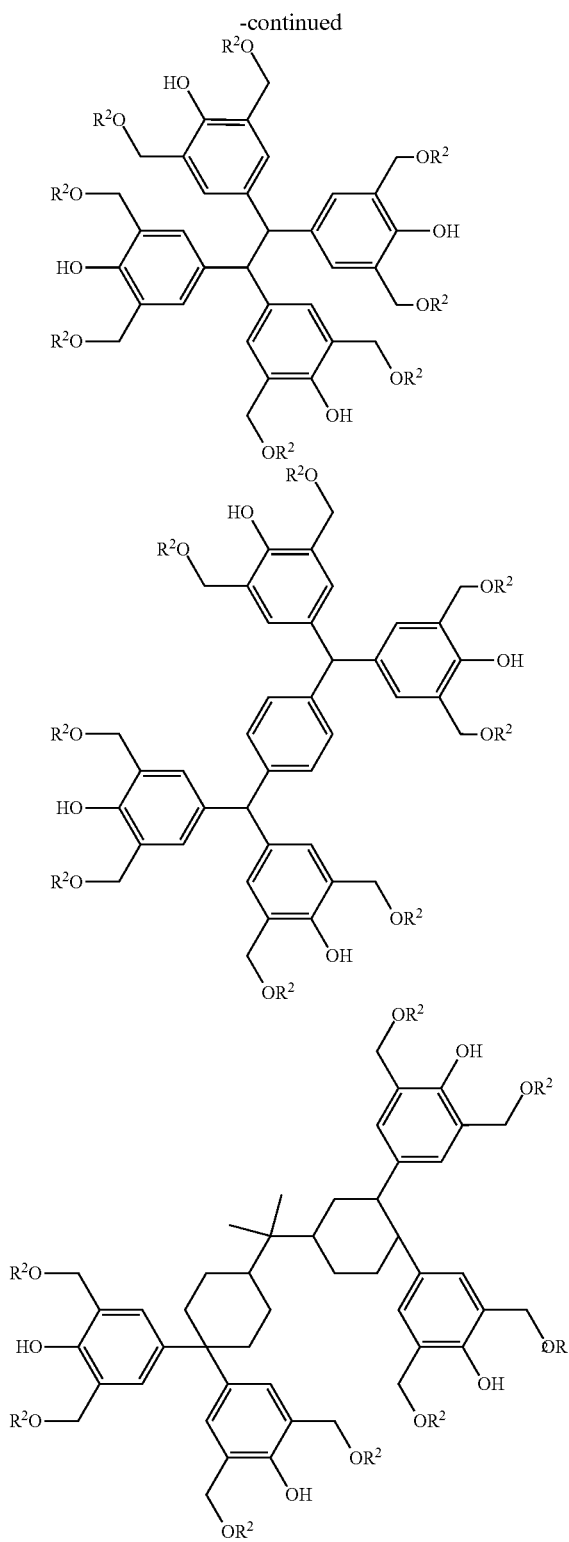

In the formulae, R² has the same meaning as defined above.

[(F) Plasticizer]

Furthermore, to the inventive resist underlayer film material, (F) a plasticizer can be added so as to enhance the planarizing and filling properties further. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A. When the plasticizer is added, the added amount is preferably 5 to 500 parts by mass, more preferably 10 to 200 parts by mass based on 100 parts by mass of the compound shown by the general formula (1).

[(G) Colorant]

Furthermore, to the inventive resist underlayer film material, (G) a colorant can be added so as to enhance the resolution during patterning in multilayer lithography further. The colorant is not particularly limited as long as the colorant is a compound that has an appropriate absorption at the exposure wavelength, and known various compounds can be widely used. Examples thereof include benzenes, naphthalenes, anthracenes, phenanthrenes, pyrenes, isocyanuric acids, and triazines. When the colorant is added, the added amount is preferably 0.01 to 10 parts by mass, more preferably 0.1 to 5 parts by mass based on 100 parts by mass of the compound shown by the general formula (1).

<Patterning Process>

In addition, the present invention provides a patterning process for forming a pattern in a substrate to be processed, including the steps of:

(I-1) applying the above-described resist underlayer film material on the substrate to be processed and then performing a heat treatment to form a resist underlayer film;

(I-2) forming a resist upper layer film on the resist underlayer film by using a photoresist material;

(I-3) subjecting the resist upper layer film to pattern exposure and then to development with a developer to form a pattern in the resist upper layer film;

(I-4) transferring the pattern to the resist underlayer film by dry etching while using the resist upper layer film having the formed pattern as a mask; and (I-5) processing the substrate to be processed while using the resist underlayer film having the formed pattern as a mask to form the pattern in the substrate to be processed (2-layer resist process).

Furthermore, the present invention provides a patterning process for forming a pattern in a substrate to be processed, including the steps of:

(II-1) applying the above-described resist underlayer film material on the substrate to be processed and then performing a heat treatment to form a resist underlayer film;

(II-2) forming a resist middle layer film on the resist underlayer film;

(II-3) forming a resist upper layer film on the resist middle layer film by using a photoresist material;

(II-4) subjecting the resist upper layer film to pattern exposure and then to development with a developer to form a pattern in the resist upper layer film;

(II-5) transferring the pattern to the resist middle layer film by dry etching while using the resist upper layer film having the formed pattern as a mask;

(II-6) transferring the pattern to the resist underlayer film by dry etching while using the resist middle layer film having the transferred pattern as a mask; and (II-7) processing the substrate to be processed while using the resist underlayer film having the formed pattern as a mask to form the pattern in the substrate to be processed (3-layer resist process).

Additionally the present invention provides a patterning process for forming a pattern in a substrate to be processed, including the steps of:
- (III-1) applying the above-described resist underlayer film material on the substrate to be processed and then performing a heat treatment to form a resist underlayer film;
- (III-2) forming an inorganic hard mask middle layer film selected from a silicon oxide film, a silicon nitride film, and a silicon oxynitride film on the resist underlayer film;
- (III-3) forming an organic thin film on the inorganic hard mask middle layer film;
- (III-4) forming a resist upper layer film on the organic thin film by using a photoresist material;
- (III-5) subjecting the resist upper layer film to pattern exposure and then to development with a developer to form a pattern in the resist upper layer film;
- (III-6) transferring the pattern to the organic thin film and the inorganic hard mask middle layer film by dry etching while using the resist upper layer film having the formed pattern as a mask;
- (III-7) transferring the pattern to the resist underlayer film by dry etching while using the inorganic hard mask middle layer film having the transferred pattern as a mask; and
- (III-8) processing the substrate to be processed while using the resist underlayer film having the formed pattern as a mask to form the pattern in the substrate to be processed (4-layer resist process).

The thickness of the resist underlayer film used in the present invention is selected appropriately, and is preferably 2 to 20,000 nm, particularly preferably 50 to 15,000 nm. In the case of a resist underlayer film for a 3-layer process, a resist middle layer film containing silicon and a resist upper layer film containing no silicon can be formed thereon. In the case of a resist underlayer film for a 2-layer process, a resist upper layer film containing silicon or a resist upper layer film containing no silicon can be formed thereon.

The inventive patterning processes are suitably used in multilayer resist processes such as a silicon-containing 2-layer resist process, a 3-layer resist process using a silicon-containing middle layer film, or a 4-layer resist process using a silicon-containing middle layer film and an organic thin film, and a 2-layer resist process with no silicon contained.

[3-Layer Resist Process]

The inventive patterning process will be described by using the following 3-layer resist process as an example, but the present invention is not limited to the process. In this case, a resist underlayer film is formed on a substrate by using the resist underlayer film material; a resist middle layer film is formed on the resist underlayer film by using a resist middle layer film material containing a silicon atom; a resist upper layer film is formed on the resist middle layer film by using a resist upper layer film material, being a photoresist composition to obtain a multilayer resist film; a resist pattern is formed in the resist upper layer film by exposing a pattern circuit region of the resist upper layer film and then developing with a developer; the resist middle layer film is etched while using the resist upper layer film having the formed pattern as a mask; the resist underlayer film is etched while using the resist middle layer film having the formed pattern as a mask; and furthermore, the substrate is processed while using the resist underlayer film having the formed pattern as a mask. Thus, the pattern can be formed in the substrate.

The resist middle layer film containing a silicon atom exhibits resistance to etching by an oxygen gas or a hydrogen gas. Thus, when the resist underlayer film is etched while using the resist middle layer film as a mask as described above, the etching is preferably performed using an etching gas mainly containing an oxygen gas or a hydrogen gas.

In addition, in the inventive patterning process, at least: a resist underlayer film is formed on a substrate by using the resist underlayer film material; an inorganic hard mask middle layer film selected from a silicon oxide film, a silicon nitride film, and a silicon oxynitride film is formed on the resist underlayer film; a resist upper layer film is formed on the inorganic hard mask middle layer film by using a resist upper layer film material containing a photoresist composition; a resist pattern is formed in the resist upper layer film by exposing a pattern circuit region of the resist upper layer film and then developing with a developer; the inorganic hard mask middle layer film is etched while using the obtained resist pattern as an etching mask; the resist underlayer film is etched while using the obtained inorganic hard mask middle layer film pattern as an etching mask; and the substrate is processed while using the obtained resist underlayer film pattern as a mask. Thus, the pattern can be formed in the substrate.

When an inorganic hard mask middle layer film is formed on the resist underlayer film as described above, a silicon oxide film, a silicon nitride film, or a silicon oxynitride film (SiON film) is formed by a CVD method, an ALD method, or the like. Methods for forming a nitride film are described in JP 2002-334869 A and WO2004/066377. The film thickness of the inorganic hard mask is 5 to 200 nm, preferably 10 to 100 nm. In particular, a SiON film, being highly effective as an antireflective coating is the most preferably used in use for ArF exposure.

As the silicon-containing resist middle layer film in the 3-layer resist process, a polysilsesquioxane-based middle layer film can be suitably used. A polysilsesquioxane-based middle layer film can be easily provided with an antireflective effect in excimer exposure, and this can suppress reflected light during pattern exposure of the resist upper layer film. Accordingly, there is an advantage that resolution is excellent. Particularly, for 193-nm light exposure, a material containing many aromatic groups is used as a resist underlayer film, so that the k-value and thus the substrate reflection are increased. However, the reflection can be suppressed by the resist middle layer film, and so the substrate reflection can be reduced to 0.5% or less. As the resist middle layer film having the antireflective effect, a polysilsesquioxane is preferably used, the polysilsesquioxane having anthracene for 248-nm and 157-nm light exposure, or a phenyl group or a light-absorbing group having a silicon-silicon bond for 193-nm light exposure in a pendant structure, and being crosslinked by an acid or heat.

In this case, forming a silicon-containing resist middle layer film by a spin-coating method is simpler and more advantageous regarding cost than a CVD method.

The resist upper layer film in the 3-layer resist film may be a positive type or a negative type, and any generally-used photoresist composition can be employed. When forming a resist upper layer film with the photoresist composition, a spin-coating method is preferably employed as when forming the resist underlayer film. After spin-coating of the photoresist composition, pre-baking is preferably performed at 60 to 180° C. for 10 to 300 seconds. Then, light exposure, post-exposure baking (PEB), and development are performed according to conventional methods to obtain the resist pattern. Note that the thickness of the resist upper layer film is not particularly limited, but is preferably 30 to 500 nm, and 50 to 400 nm is particularly preferable.

Examples of exposure light include a high-energy beam with a wavelength of 300 nm or less, and specific examples include a 248-nm, 193-nm, and 157-nm excimer laser, a soft X-ray of 3 to 20 nm, an electron beam, X-ray, and the like.

Next, etching is performed while using the obtained resist pattern as a mask. In the 3-layer process, the resist middle layer film is etched using a fluorocarbon-based gas while using the resist pattern as a mask. Subsequently, the resist underlayer film is etched using an oxygen gas or a hydrogen gas while using the resist middle layer film pattern as a mask.

The subsequent etching of the substrate to be processed can also be performed according to a conventional method. For example, the substrate made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing middle layer in the 3-layer process is removed when the substrate is processed. When the substrate is etched with a chlorine- or bromine-based gas, the silicon-containing middle layer needs to be removed by additional dry etching with a fluorocarbon-based gas or the like after the substrate processing.

As the substrate to be processed, a layer to be processed is formed on a substrate. The substrate is not particularly limited, and Si, $\alpha$-Si, p-Si, $SiO_2$, SiN, SiON, W, TiN, Al, etc. that is a different material from that of the layer to be processed is used. As the layer to be processed, various Low-k films made of Si, $SiO_2$, SiON, SiN, p-Si, $\alpha$-Si, W, TiN, W—Si, Al, Cu, Al—Si, or the like, stopper films thereof, etc. are used. Generally, the layer is formed to have a thickness of 50 to 10,000 nm, in particular, 100 to 5,000 nm.

The inventive patterning processes are also suitable for processing a stepped substrate having a structure or a step with a height of 30 nm or more. By forming the resist underlayer film of the present invention on a stepped substrate for filling and planarization, it becomes possible to make the film thickness of the resist middle layer film and resist upper layer film to be subsequently formed uniform. Thus, it becomes easy to ensure an exposure depth margin (DOF) during photolithography, and this is extremely desirable.

Hereinbelow, an example of the 3-layer resist process will be specifically described with reference to FIG. 1. As shown in FIG. 1 (A), in the 3-layer resist process, a resist underlayer film 3 is formed on a layer 2 to be processed that has been stacked on a substrate 1. Then, a resist middle layer film 4 is formed, and a resist upper layer film 5 is formed thereon.

Next, as shown in FIG. 1 (B), a predetermined portion 6 of the resist upper layer film is exposed to light, followed by PEB (post-exposure baking) and development; to form a resist upper layer film pattern 5a (FIG. 1 (C)). While using the obtained resist upper layer film pattern 5a as a mask, the resist middle layer film 4 is etched with a CF-based gas. Thereby, a resist middle layer film pattern 4a is formed (FIG. 1 (D)). After the resist upper layer film pattern 5a is removed, the resist underlayer film 3 is etched with oxygen- or hydrogen-based plasma while using the obtained resist middle layer film pattern 4a as a mask. Thereby, a resist underlayer film pattern 3a is formed (FIG. 1 (E)). Further, after removing the resist middle layer film pattern 4a, the layer 2 to be processed is etched while using the resist underlayer film pattern 3a as a mask. Thus, a pattern 2a is formed (FIG. 1 (F)).

When an inorganic hard mask middle layer film is used, the resist middle layer film 4 is the inorganic hard mask middle layer film, and when an organic thin film is formed, the organic thin film layer is disposed between the resist middle layer film 4 and the resist upper layer film 5. The etching of the organic thin film may be performed continuously before the etching of the resist middle layer film 4. Alternatively, after the organic thin film is etched alone, the etching apparatus is changed, for example, and then the etching of the resist middle layer film 4 may be performed.

[4-Layer Resist Process]

The present invention can also be suitably employed in a 4-layer resist process in which an organic thin film is used. In this case, at least: a resist underlayer film is formed on a substrate by using the resist underlayer film material; an inorganic hard mask middle layer film selected from a silicon oxide film, a silicon nitride film, and a silicon oxynitride film is formed on the resist underlayer film; an organic thin film is formed on the inorganic hard mask middle layer film; a resist upper layer film is formed on the organic thin film by using a resist upper layer film material containing a photoresist composition; a resist pattern is formed in the resist upper layer film by exposing a pattern circuit region of the resist upper layer film and then developing with a developer; the organic thin film and the inorganic hard mask middle layer film are etched while using the obtained resist pattern as an etching mask; the resist underlayer film is etched while using the obtained inorganic hard mask middle layer film pattern as an etching mask; and the substrate is processed while using the obtained resist underlayer film pattern as a mask. Thus, the pattern can be formed in the substrate.

A photoresist film may be formed on the resist middle layer film as the resist upper layer film. Alternatively, an organic thin film may be formed on the resist middle layer film by spin-coating, and a photoresist film may be formed thereon as described above. When a SiON film is used as the resist middle layer film and an organic antireflective coating (BARC) having a light-absorbing group at an exposure wavelength is used as the organic thin film, two antireflective coatings including the SiON film and the organic thin film make it possible to suppress the reflection even in liquid immersion exposure at a high NA exceeding 1.0 in excimer exposure. Other advantages of forming an organic thin film include having an effect of reducing trailing of the photoresist pattern immediately above the SiON. There is also an advantage that pattern collapse of the photoresist can be suppressed when an adhesive film (ADL) having an excellent affinity with the upper layer photoresist is used as the organic thin film.

<Method for Forming Resist Underlayer Film>

The present invention provides a method for forming a resist underlayer film that functions as an organic flat film employed in a semiconductor device manufacturing process, the method including:

spin-coating a substrate to be processed with the above-described resist underlayer film material; and heating the substrate coated with the resist underlayer film material at a temperature of 100° C. or higher to 600° C. or lower for 10 to 600 seconds to form a cured film.

In addition, the present invention provides a method for forming a resist underlayer film that functions as an organic flat film employed in a semiconductor device manufacturing process, the method including:

spin-coating a substrate to be processed with the above-described resist underlayer film material; and heating the substrate coated with the resist underlayer film material in an atmosphere having an oxygen concentration of 1% or more to 21% or less to form a cured film.

Alternatively, the present invention provides a method for forming a resist underlayer film that functions as an organic flat film employed in a semiconductor device manufacturing process, the method including:

spin-coating a substrate to be processed with the above-described resist underlayer film material; and heating the substrate coated with the resist underlayer film material in an atmosphere having an oxygen concentration of less than 1% to form a cured film.

In the inventive method for forming a resist underlayer film, the substrate to be processed is coated with the above-described resist underlayer film material by employing a spin-coating method or the like. By employing a spin-coating method or the like, a favorable filling property can be achieved. After spin-coating, the solvent is evaporated, and in order to prevent mixing with the resist upper layer film or the resist middle layer film, baking is performed to promote a crosslinking reaction. The baking is performed at a temperature of 100° C. or higher to 600° C. or lower, preferably 100° C. or higher to 300° C. or lower, more preferably 150° C. or higher to 280° C. or lower for 10 seconds to 600 seconds, preferably 10 to 300 seconds. By appropriately adjusting the baking temperature and time within the above ranges, it is possible to achieve planarizing and filling properties and curing property suitable for the usage. When the baking temperature is 100° C. or higher, the curing progresses sufficiently, so that mixing with the upper layer film or the middle layer film does not occur. When the baking temperature is 600° C. or lower, thermal decomposition of the base resin can be suppressed, and the film thickness does not decrease, so that the film surface becomes uniform.

As the atmosphere at the time of baking, it is possible to select either of an oxygen-containing atmosphere such as air (oxygen concentration: 1% to 21%) and a non-oxygen atmosphere such as nitrogen as necessary. For example, when the substrate to be processed is liable to be oxidized by air, damage to the substrate can be suppressed by heating in an atmosphere having an oxygen concentration of less than 1% to form a cured film.

Furthermore, in the inventive method for forming a resist underlayer film, it is also preferable to use, as the substrate to be processed, a substrate having a structure or a step with a height of 30 nm or more. In particular, the inventive method for forming a resist underlayer film is particularly useful when forming a flat organic film with no voids on a substrate having a structure or a step with a height of 30 nm or more.

EXAMPLE

Hereinafter, the present invention will be specifically described with reference to Examples and Comparative Examples. However, the present invention is not limited thereto. Note that the molecular weight and dispersity were measured by the following method. Weight-average molecular weight (Mw) and dispersity (Mw/Mn) were determined by gel permeation chromatography (GPC) using tetrahydrofuran as an eluent in terms of polystyrene. Meanwhile, the introducing ratio of terminal groups was calculated by 1H NMR.

Synthesis Examples: Synthesis of Compounds used in Resist Underlayer Film Material Compounds (D1) to (D16) for resist underlayer film materials, compounds (R1) to (R4) for Comparative Examples, and polymer (R5) for Comparative Examples were synthesized using triple-bond-containing carboxylic acid compounds (compounds A: (A1) to (A5)), carboxylic acids containing a phenolic hydroxy group (compounds B: (BI) to (6)), and epoxy compounds (compounds C: (C1) to (C7)) shown below.

(A1)

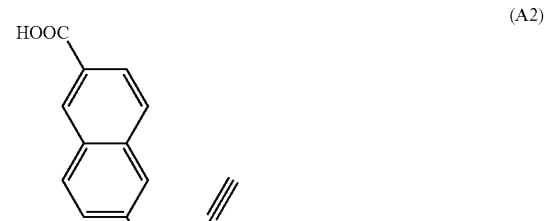

(A2)

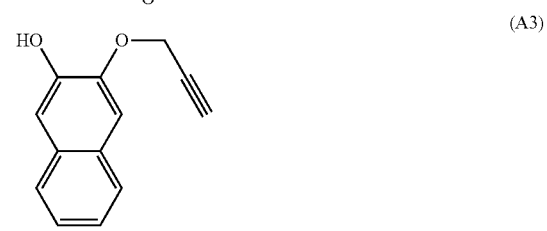

(A3)

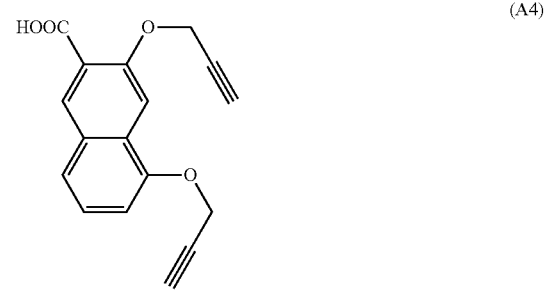

(A4)

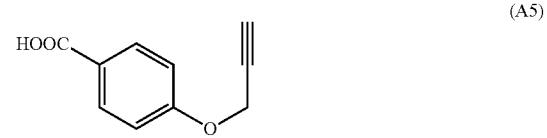

(A5)

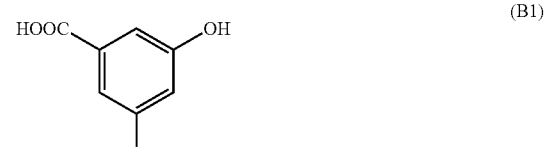

(B1)

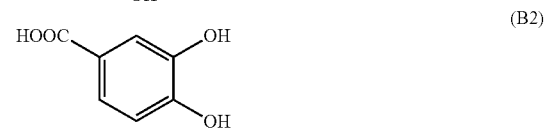

(B2)

-continued (B3) 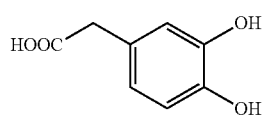

(B4) 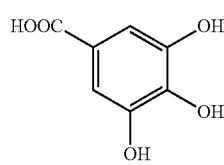

(B5) 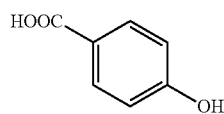

(B6) 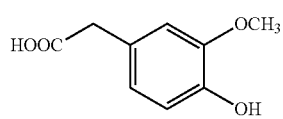

(C1) 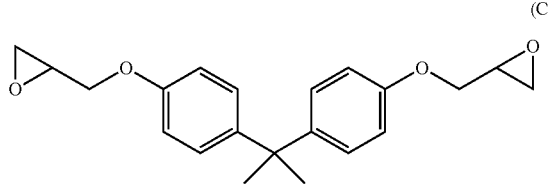

(C2) 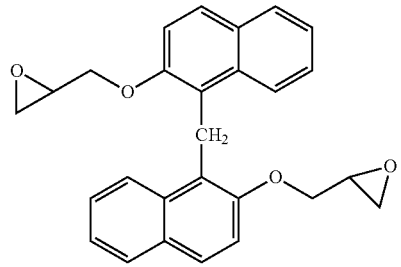

(C3) 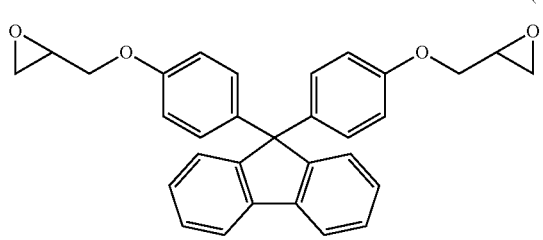

(C4) 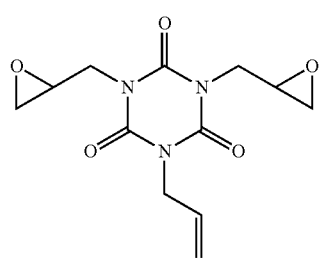

-continued (C5) 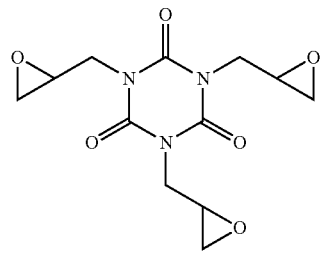

(C6) 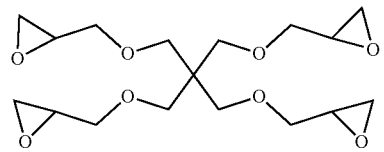

(C7) 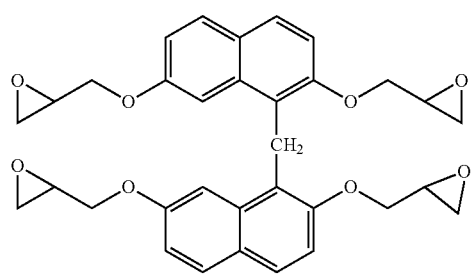

[Synthesis Example 1] Synthesis of Compound (D1)

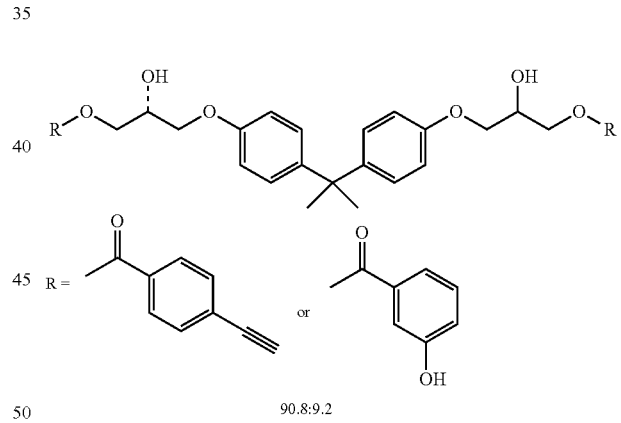

90.8:9.2

A homogeneous solution of 12.44 g of a triple-bond-containing carboxylic acid compound (A1), 1.46 g of a carboxylic acid compound (BI) containing a phenolic hydroxy group, 16.10 g of an epoxy compound (C1), and 60 g of 2-methoxy-1-propanol was formed under a nitrogen atmosphere at an inner temperature of 100° C. by stirring. Then, 1.00 g of benzyltriethylammonium chloride was added, and was stirred at an inner temperature of 110° C. for 12 hours. After cooling to room temperature, 200 ml of methyl isobutyl ketone was added, and the resultant was washed twice with 100 g of a 1 wt % aqueous ammonia solution, twice with 100 g of a 3% aqueous nitric acid solution, and five times with 100 g of ultrapure water in this order. The organic layer was evaporated under reduced pressure to dryness to obtain compound (D1).

When the weight-average molecular weight (Mw) and dispersity (Mw/Mn) were measured by GPC, the results were: Mw=980; and Mw/Mn=1.03.

The terminal group ratio calculated by 1H NMR was: triple-bond-containing terminal group/terminal group containing a phenolic hydroxy group=90.8/9.2.

[Synthesis Examples 2 to 20] Synthesis of Compounds (D2) to (D16) and Compounds (R1) to (R4) for Comparative Examples Except that the compounds A, compounds B, and compounds C shown in Table 1 were used, the compounds (D2) to (D16) and (R1) to (R4) shown in Tables 2 to 6 were obtained as products under the same conditions as Synthesis Example 1. The weight-average molecular weight (Mw), dispersity (Mw/Mn), and terminal group ratio (triple-bond-containing group/group containing a phenolic hydroxy group) of these compounds were determined and shown in Table 7.

TABLE 1

| Synthesis Example | Compounds A | Compounds B | Compounds C | Product |
|---|---|---|---|---|
| 1 | A1: 12.44 g | B1: 1.46 g | C1: 16.10 g | D1 |
| 2 | A2: 15.69 g | B2: 1.19 g | C1: 13.12 g | D2 |
| 3 | A2: 14.32 g | B3: 1.18 g | C2: 14.50 g | D3 |

TABLE 1-continued

| Synthesis Example | Compounds A | Compounds B | Compounds C | Product |
|---|---|---|---|---|
| 4 | A3: 13.38 g | B2: 1.16 g | C2: 15.46 g | D4 |
| 5 | A2: 13.56 g | B2: 1.03 g | C3: 15.41 g | D5 |
| 6 | A4: 13.74 g | B4: 2.09 g | C3: 14.17 g | D6 |
| 7 | A3: 16.00 g | B2: 1.38 g | C4: 12.62 g | D7 |
| 8 | A4: 17.67 g | B4: 1.89 g | C4: 10.43 g | D8 |
| 9 | A2: 17.02 g | B2: 3.37 g | C5: 9.62 g | D9 |
| 10 | A2: 19.48 g | B2: 1.21 g | C5: 9.31 g | D10 |
| 11 | A2: 17.92 g | B3: 2.66 g | C5: 9.42 g | D11 |
| 12 | A5: 16.22 g | B2: 2.84 g | C5: 10.95 g | D12 |
| 13 | A1: 15.70 g | B2: 2.92 g | C6: 11.38 | D13 |
| 14 | A2: 18.75 g | B3: 2.46 g | C6: 8.79 g | D14 |
| 15 | A2: 16.27 g | B2: 1.96 g | C7: 11.77 g | D15 |
| 16 | A4: 17.75 g | B3: 1.88 g | C7: 10.37 g | D16 |
| 17 | A2: 19.80 g | — | C5: 10.20 g | R1 |
| 18 | A2: 14.12 g | B2: 5.90 g | C5: 9.98 g | R2 |
| 19 | A2: 19.78 g | B5: 0.91 g | C5: 9.31 g | R3 |
| 20 | A2: 18.10 g | B6: 2.57 g | C5: 9.33 g | R4 |

TABLE 2

| Synthesis Example | Compound |
|---|---|
| 1 | 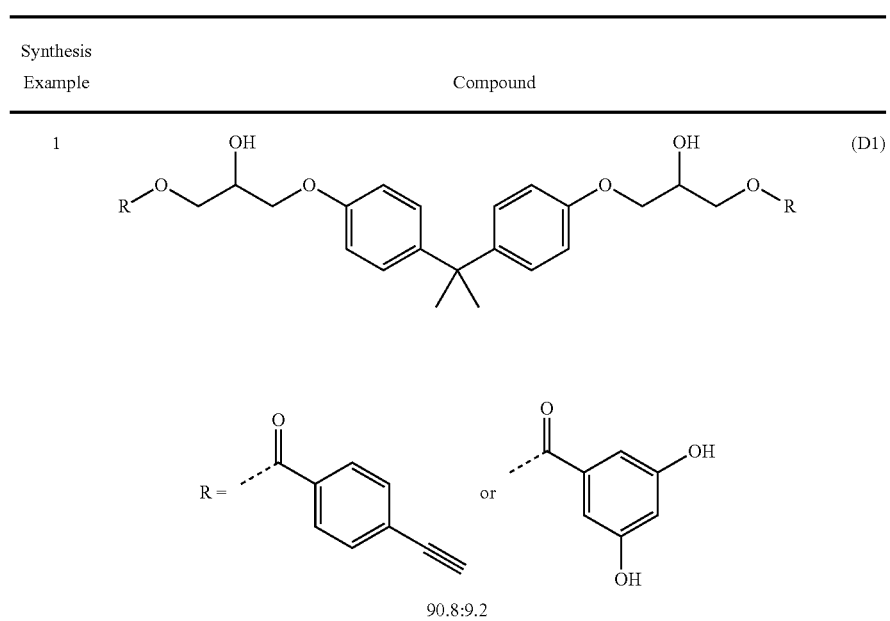 (D1) |
| 2 | 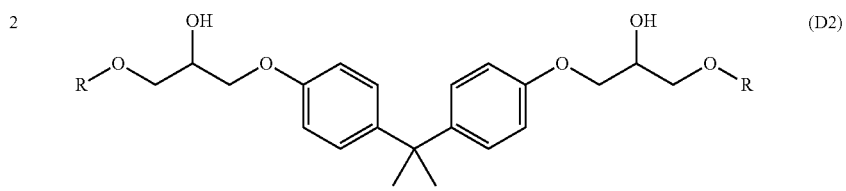 (D2) |

TABLE 2-continued
| Synthesis Example | Compound |
|---|---|
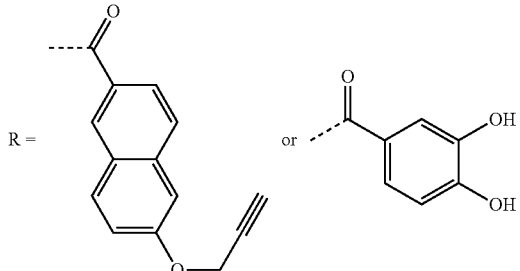
91.8:8.2
3 (D3)
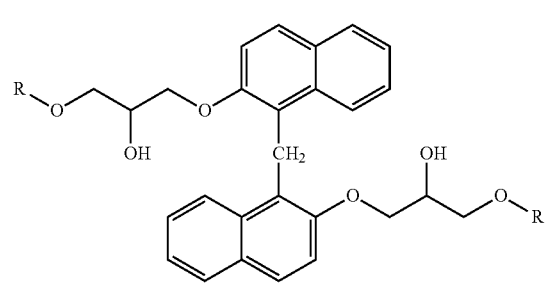
91.2:8.8
4 (D4)
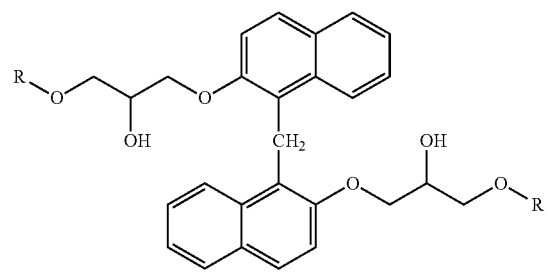
91.48.6

TABLE 3

| Synthesis Example | Compound |
|---|---|
| 5 | (D5) structure: bis-aryloxy-propanol derivative of 9,9-bis(4-hydroxyphenyl)fluorene with R groups; R = 6-(prop-2-ynyloxy)naphthalene-2-carbonyl or 3,4-dihydroxybenzoyl; ratio 90.9:9.1 |
| 6 | (D6) structure: bis-aryloxy-propanol derivative of 9,9-bis(4-hydroxyphenyl)fluorene with R groups; R = 3,8-bis(prop-2-ynyloxy)naphthalene-2-carbonyl or 3,4,5-trihydroxybenzoyl; ratio 84.6:15.4 |
| 7 | (D7) structure: isocyanurate with two N-(2-hydroxy-3-OR-propyl) substituents and one N-allyl substituent |

TABLE 3-continued
| Synthesis Example | Compound |
|---|---|
| | 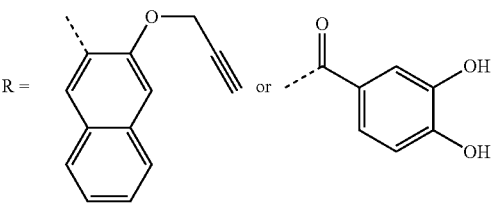 R = 92.8:7.2 |
| 8 | 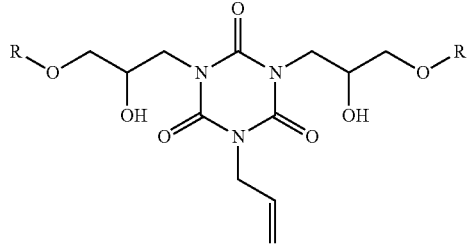 (D8) 89.6:10.4 |
TABLE 4
| Synthesis Example | Compound |
|---|---|
| 9 | 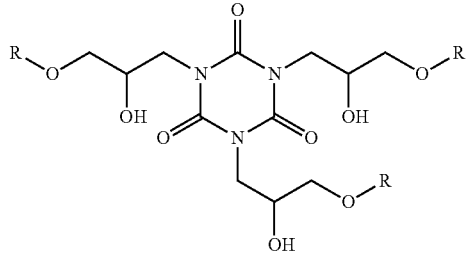 (D9) |

TABLE 4-continued
| Synthesis Example | Compound |
|---|---|
R = 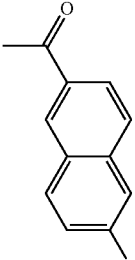 or 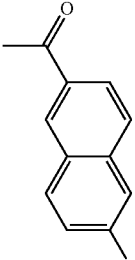
80.5:19.5
10     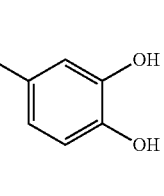 (D10)
R = 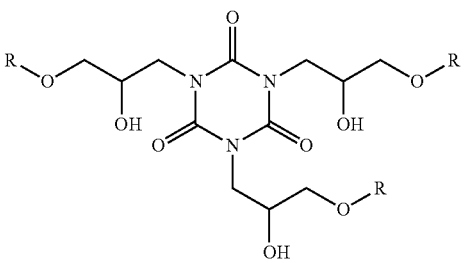 or 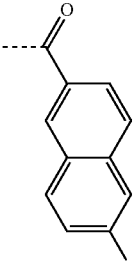
94.3:5.7
11     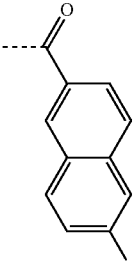 (D11)
R = 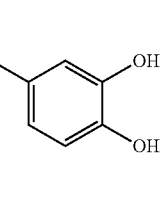 or 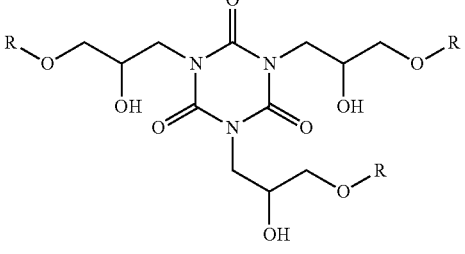
85.1:14.9

TABLE 4-continued
| Synthesis Example | Compound |
|---|---|
| 12 | 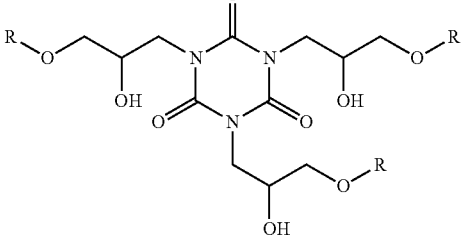 (D12)<br>86.7:13.3 |
TABLE 5
| Synthesis Example | Compound |
|---|---|
| 13 | 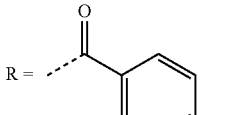 (D13)<br>89.7:10.3 |
| 14 | 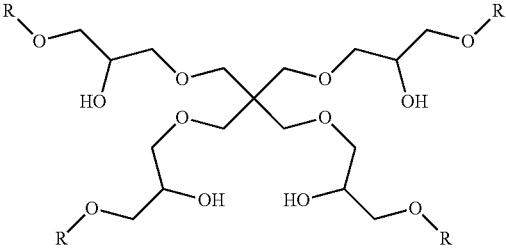 (D14) |

TABLE 5-continued
| Synthesis Example | Compound |
|---|---|
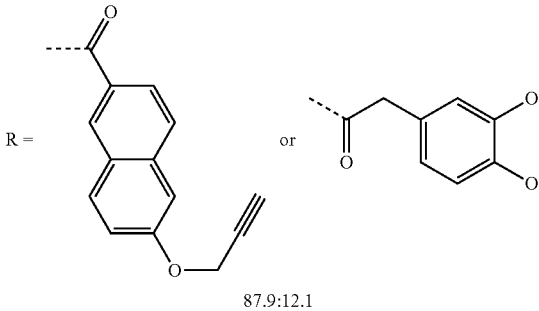
87.9:12.1
15 (D15)
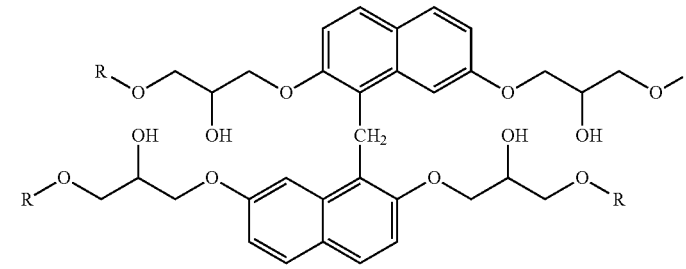
86.3:13.7
16 (D16)
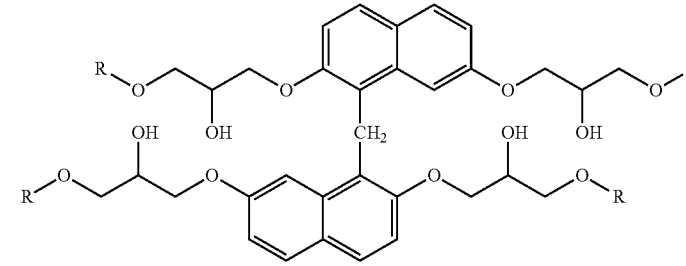
86.1:13.9

TABLE 6
| Synthesis Example | Compound |
|---|---|
| 17 | 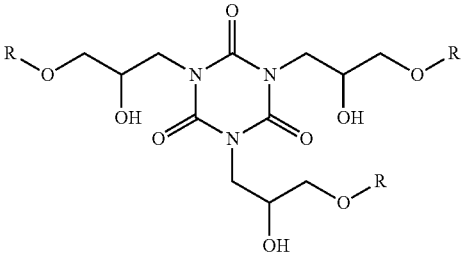 (R1) |
| 18 | 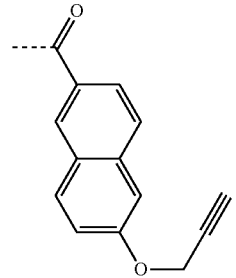 (R2) 69.3:30.7 |
| 19 | 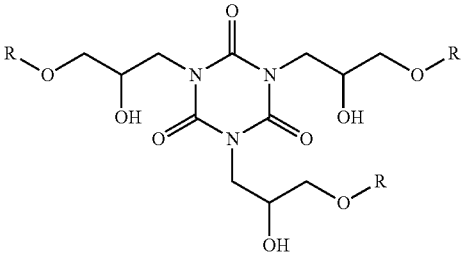 (R3) |

TABLE 6-continued
| Synthesis Example | Compound |
|---|---|
| | 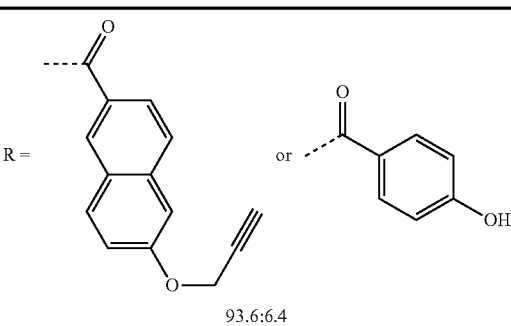 93.6:6.4 |
| 20 (R4) | 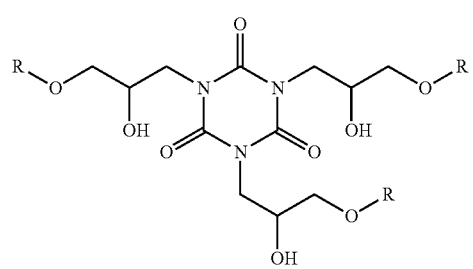 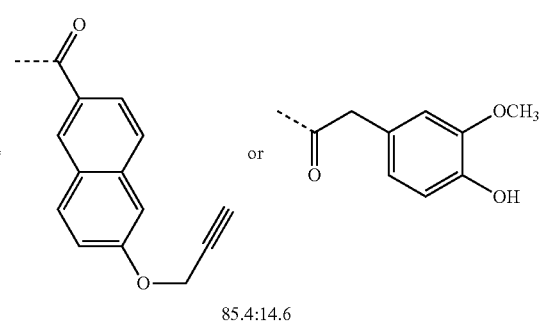 85.4:14.6 |
TABLE 7
| Synthesis Example | Mw | Mw/Mn | Terminal group ratio (triple-bond-containing group/ group containing a phenolic hydroxy group) |
|---|---|---|---|
| 1 | 980 | 1.03 | 90.8/9.2 |
| 2 | 1120 | 1.05 | 91.8/8.2 |
| 3 | 1260 | 1.22 | 91.2/8.8 |
| 4 | 1180 | 1.18 | 91.4/8.6 |
| 5 | 910 | 1.03 | 90.9/9.1 |
| 6 | 1020 | 1.09 | 84.6/15.4 |
| 7 | 710 | 1.06 | 92.8/7.2 |
| 8 | 840 | 1.08 | 89.6/10.4 |
| 9 | 1200 | 1.08 | 80.5/19.5 |
| 10 | 1070 | 1.05 | 94.3/5.7 |
| 11 | 1220 | 1.06 | 85.1/14.9 |
| 12 | 930 | 1.06 | 86.7/13.3 |
| 13 | 1150 | 1.11 | 89.7/10.3 |
| 14 | 1430 | 1.13 | 87.9/12.1 |
| 15 | 2250 | 1.34 | 86.3/13.7 |
| 16 | 2380 | 1.37 | 86.1/13.9 |
| 17 | 1100 | 1.03 | 100.0/0.0 |
| 18 | 990 | 1.12 | 69.3/30.7 |
| 19 | 1030 | 1.05 | 94.6/6.4 |
| 20 | 1190 | 1.06 | 85.4/14.6 |

[Synthesis Example 21] Synthesis of Comparative Polymer (R5)

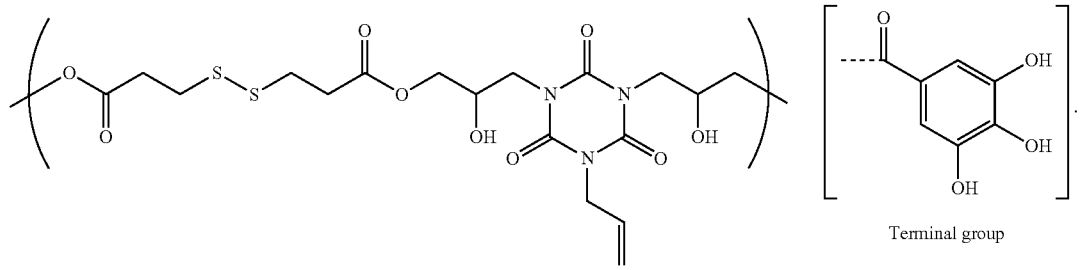

Terminal group 4.11 g of a carboxylic acid compound (84) containing a phenolic hydroxy group, 12.69 g of a 3,3'-dithiopropionic acid, 20.00 g of an epoxy compound (C4), and 1.00 g of tetrabutylphosphonium were dissolved in 60 g of 2-methoxy-1-propanol. Then, the resultant was stirred under a nitrogen atmosphere at an inner temperature of 105° C. for 24 hours. After dissolving until room temperature, the resultant was evaporated under reduced pressure to dryness to obtain a polymer (R5) having a phenolic hydroxy group in a terminal structure. When the weight-average molecular weight (Mw) and dispersity (Mw/Mn) were measured by GPC, the results were: Mw=3300; and Mw/Mn=1.78.

Preparation of Resist Underlayer Film Materials (UDL-1 to -18, Comparative UDL-1 to -5)

The following were used: the compounds (D1) to (D16) and (R1) to (R5); (S1) tripropylene glycol monomethyl ether having a boiling point of 242° C. and (S2) 1,6-diacetoxyhexane having a boiling point of 260° C. as high-boiling-point solvents; and (TAG) pyridinium triflate as a thermal acid generator. Using propylene glycol monomethyl ether acetate (PGMEA) containing 0.1 mass % of PF6320 (manufactured by OMNOVA) or 2-methoxy-1-propanol (PGME), the compounds were dissolved in proportions shown in Table 8. The solution was then filtered through a 0.1-µm filter made of fluorinated resin to prepare resist underlayer film materials (UDL-1 to -18, comparative UDL-1 to -5).

TABLE 8

| Resist underlayer film material | Compound or polymer (parts by mass) | High-boiling-point solvent (parts by mass) | PGME (parts by mass) | PGMEA (parts by mass) | Additive (parts by mass) |
|---|---|---|---|---|---|
| UDL-1 | D1 (10) | — | — | 90 | — |
| UDL-2 | D2 (10) | — | — | 90 | — |
| UDL-3 | D3 (10) | — | — | 90 | — |
| UDL-4 | D4 (10) | — | — | 90 | — |
| UDL-5 | D5 (10) | — | — | 90 | — |
| UDL-6 | D6 (10) | — | — | 90 | — |
| UDL-7 | D7 (10) | — | — | 90 | — |
| UDL-8 | D8 (10) | — | — | 90 | — |
| UDL-9 | D9 (10) | — | — | 90 | — |
| UDL-10 | D10 (10) | — | — | 90 | — |
| UDL-11 | D11 (10) | — | — | 90 | — |
| UDL-12 | D12 (10) | — | — | 90 | — |
| UDL-13 | D13 (10) | — | — | 90 | — |
| UDL-14 | D14 (10) | — | — | 90 | — |
| UDL-15 | D15 (10) | — | — | 90 | — |
| UDL-16 | D16 (10) | — | — | 90 | — |
| UDL-17 | D10 (10) | S1 (10) | — | 80 | — |
| UDL-18 | D15 (10) | S2 (10) | — | 90 | — |
| Comparative UDL-1 | R1 (10) | — | — | 90 | — |
| Comparative UDL-2 | R2 (10) | — | — | 90 | — |
| Comparative UDL-3 | R3 (10) | — | — | 90 | — |
| Comparative UDL-4 | R4 (10) | — | — | 90 | — |
| Comparative UDL-5 | R5 (10) | — | 80 | 10 | TAG (0.2) |

Example 1: Solvent Resistance Evaluation (Examples 1-1 to 1-18, Comparative Examples 1-1 to -1-5)

The resist underlayer film materials (UDL-1 to -18, comparative UDL-1 to -5) prepared above were each applied onto a silicon substrate and baked at 250° C. for 60 seconds. Then, the film thickness was measured. A PGMEA solvent was dispensed thereon, left to stand for 30 seconds, spin-dried, and baked at 100° C. for 60 seconds to evaporate the PGMEA solvent. The film thickness was then remeasured. Solvent resistance was evaluated by determining the difference between the film thicknesses before and after the PGMEA treatment. Table 9 shows the results.

TABLE 9

| | Resist underlayer film material | Film thickness after film formation: a (Å) | Film thickness after PGMEA treatment: b (Å) | b/a × 100 (%) | Baking conditions (° C.) |
|---|---|---|---|---|---|
| Example 1-1 | UDL-1 | 2014 | 1989 | 98.8 | 300° C. × 60 sec. |
| Example 1-2 | UDL-2 | 2004 | 2000 | 99.8 | 250° C. × 60 sec. |
| Example 1-3 | UDL-3 | 1998 | 1994 | 99.8 | 250° C. × 60 sec. |
| Example 1-4 | UDL-4 | 2004 | 2000 | 99.8 | 250° C. × 60 sec. |
| Example 1-5 | UDL-5 | 1995 | 1992 | 99.8 | 250° C. × 60 sec. |
| Example 1-6 | UDL-6 | 1997 | 1996 | 99.9 | 250° C. × 60 sec. |
| Example 1-7 | UDL-7 | 1999 | 1998 | 99.9 | 250° C. × 60 sec. |
| Example 1-8 | UDL-8 | 1999 | 1996 | 99.8 | 250° C. × 60 sec. |
| Example 1-9 | UDL-9 | 2009 | 2004 | 99.8 | 250° C. × 60 sec. |
| Example 1-10 | UDL-10 | 2008 | 2004 | 99.8 | 250° C. × 60 sec. |
| Example 1-11 | UDL-11 | 1995 | 1993 | 99.9 | 250° C. × 60 sec. |

TABLE 9-continued

| Resist underlayer film material | Film thickness after film formation: a (Å) | Film thickness after PGMEA treatment: b (Å) | b/a × 100 (%) | Baking conditions (° C.) |
|---|---|---|---|---|
| Example 1-12 UDL-12 | 2014 | 1992 | 98.9 | 250° C. × 60 sec. |
| Example 1-13 UDL-13 | 2015 | 1990 | 98.8 | 300° C. × 60 sec. |
| Example 1-14 UDL-14 | 1995 | 1994 | 99.9 | 250° C. × 60 sec. |
| Example 1-15 UDL-15 | 2000 | 1997 | 99.9 | 250° C. × 60 sec. |
| Example 1-16 UDL-16 | 2010 | 2007 | 99.9 | 250° C. × 60 sec. |
| Example 1-17 UDL-17 | 2003 | 1999 | 99.8 | 250° C. × 60 sec. |
| Example 1-18 UDL-18 | 1997 | 1996 | 99.9 | 250° C. × 60 sec. |
| Comparative Example 1-1 Comparative UDL-1 | 2002 | 2000 | 99.9 | 250° C. × 60 sec. |
| Comparative Example 1-2 Comparative UDL-2 | 2015 | 1964 | 97.5 | 250° C. × 60 sec. |
| Comparative Example 1-3 Comparative UDL-3 | 2010 | 2007 | 99.9 | 250° C. × 60 sec. |
| Comparative Example 1-4 Comparative UDL-4 | 2005 | 2000 | 99.8 | 300° C. × 60 sec. |
| Comparative Example 1-5 Comparative UDL-5 | 2010 | 2007 | 99.9 | 250° C. × 60 sec. |

As shown by Examples 1-1 to 1-18 in Table 9, in every case where the compound of the present invention was used, the resist underlayer film material had little film loss due to treatment with a solvent, and it can be observed that a film having favorable solvent resistance was obtained. In particular, the materials that contained a naphthalene-type terminal group structure as a triple-bond-containing terminal group had more excellent film remaining percentage than in Example 1-1, 1-12, 1-13, in which a benzene-type terminal group structure was contained. Thus, it can be observed that curing reaction is taking place more efficiently. Meanwhile, comparing Examples 1-9, 1-10, and Comparative Example 1-2 having different terminal group ratios, film loss of more than 2% had occurred in Comparative Example 1-2 due to the reduction of the ratio of terminal groups that contribute to the crosslinking reaction, and degradation in curability was observed.

Example 2: Film-Formability Evaluation (Examples 2-1 to 2-18, Comparative Examples 2-1 to 2-5)

Each of the resist underlayer film materials (UDL-1 to -18, comparative UDL-1 to -5) prepared above were applied onto each of a Bare-Si substrate, a substrate treated with hexamethyldisilazane (HMDS), and a substrate treated with SiON, which are shown in Table 10, and baked at 250° C. for 60 seconds to form a resist underlayer film with a film thickness of 100 nm. The organic films thus formed were observed with an optical microscope (ECLIPSE L200 manufactured by Nikon INSTECH CO., LTD.) to check for coating abnormality. Note that in the present evaluation, the film thickness is made thin in order to evaluate the coatability. This is a severe evaluation condition where film formation abnormality is liable to occur.

TABLE 10

| Resist underlayer film material | Bare-Si substrate | HMDS-treated substrate | SiON-treated substrate |
|---|---|---|---|
| Example 2-1 UDL-1 | No abnormality | Several pinhole defects | No abnormality |
| Example 2-2 UDL-2 | No abnormality | No abnormality | No abnormality |
| Example 2-3 UDL-3 | No abnormality | No abnormality | No abnormality |
| Example 2-4 UDL-4 | No abnormality | No abnormality | No abnormality |
| Example 2-5 UDL-5 | No abnormality | No abnormality | No abnormality |
| Example 2-6 UDL-6 | No abnormality | Several pinhole defects | No abnormality |
| Example 2-7 UDL-7 | No abnormality | No abnormality | No abnormality |
| Example 2-8 UDL-8 | No abnormality | Several pinhole defects | No abnormality |
| Example 2-9 UDL-9 | No abnormality | No abnormality | No abnormality |
| Example 2-10 UDL-10 | No abnormality | No abnormality | No abnormality |
| Example 2-11 UDL-11 | No abnormality | No abnormality | No abnormality |
| Example 2-12 UDL-12 | No abnormality | No abnormality | No abnormality |
| Example 2-13 UDL-13 | No abnormality | No abnormality | No abnormality |
| Example 2-14 UDL-14 | No abnormality | No abnormality | No abnormality |
| Example 2-15 UDL-15 | No abnormality | No abnormality | No abnormality |
| Example 2-16 UDL-16 | No abnormality | No abnormality | No abnormality |
| Example 2-17 UDL-17 | No abnormality | No abnormality | No abnormality |
| Example 2-18 UDL-18 | No abnormality | No abnormality | No abnormality |
| Comparative Example 2-1 Comparative UDL-1 | No abnormality | Countless pinhole defects | Several pinhole defects |
| Comparative Example 2-2 Comparative UDL-2 | No abnormality | No abnormality | No abnormality |
| Comparative Example 2-3 Comparative UDL-3 | No abnormality | Countless pinhole defects | Several pinhole defects |
| Comparative Example 2-4 Comparative UDL-4 | No abnormality | Countless pinhole defects | Several pinhole defects |
| Comparative Example 2-5 Comparative UDL-5 | No abnormality | No abnormality | No abnormality |

As shown in Table 10, in Examples 2-1, 2-6, and 2-8, in which a catechol terminal structure was not contained, a few pinholes were generated on the substrate treated with HMDS. However, in the other Examples, in which a catechol-type terminal structure was contained, a uniform resist underlayer film having no substrate dependency and no coating abnormality was successfully formed. Note that in Examples 2-1, 2-6, and 2-8, film-formability had been improved, compared with Comparative Example 2-1, on the SiON-treated substrate by the effect of the introduction of a terminal structure having a plurality of phenolic hydroxy groups. The number of pinholes had decreased even on the HMDS-treated substrate, and the effect of improvement can be observed. In addition, comparing Examples 2-9, 2-10, and 2-11 with Comparative Examples 2-1, 2-3, and 2-4, it can be observed that film-formability had been improved by the introduction of a catechol-type terminal structure. Accordingly, it can be conjectured that the formation of pinholes was suppressed by the cohesion of the film during baking caused by the effect of enhancing adhesiveness to the substrate.

Example 3: Filling Property Evaluation (Examples 3-1 to 3-18, Comparative Examples 3-1 to 3-5)

The resist underlayer film materials (UDL-1 to -18, comparative UDL- 1 to -5) prepared above were each applied onto a SiO$_2$ wafer substrate having a dense hole pattern (hole diameter: 0.16 μm, hole depth: 0.50 μm, distance between the centers of two adjacent holes: 0.32 μm) and baked at 250° C. for 60 seconds to form a resist underlayer film. The substrate used was a base substrate 7 (SiO$_2$ wafer substrate) having a dense hole pattern as shown in FIG. 2 (G) (top view) and (H) (sectional view). The sectional shapes of the resulting wafer substrates were observed with a scanning electron microscope (SEM) to check whether or not the holes were filled with the resist underlayer film 8 without voids (space). Table 11 shows the results. If a resist underlayer film material having poor filling property is used, voids occur inside the holes in this evaluation. When a resist underlayer film material having good filling property is used, the holes are filled with the resist underlayer film without voids in this evaluation as shown in FIG. 2 (I).

TABLE 11

| | Resist underlayer film material | Presence/absence of voids |
|---|---|---|
| Example 3-1 | UDL-1 | Absent |
| Example 3-2 | UDL-2 | Absent |
| Example 3-3 | UDL-3 | Absent |
| Example 3-4 | UDL-4 | Absent |
| Example 3-5 | UDL-5 | Absent |
| Example 3-6 | UDL-6 | Absent |
| Example 3-7 | UDL-7 | Absent |
| Example 3-8 | UDL-8 | Absent |
| Example 3-9 | UDL-9 | Absent |
| Example 3-10 | UDL-10 | Absent |
| Example 3-11 | UDL-11 | Absent |
| Example 3-12 | UDL-12 | Absent |
| Example 3-13 | UDL-13 | Absent |
| Example 3-14 | UDL-14 | Absent |
| Example 3-15 | UDL-15 | Absent |
| Example 3-16 | UDL-16 | Absent |
| Example 3-17 | UDL-17 | Absent |
| Example 3-18 | UDL-18 | Absent |
| Comparative Example 3-1 | Comparative UDL-1 | Absent |
| Comparative Example 3-2 | Comparative UDL-2 | Absent |
| Comparative Example 3-3 | Comparative UDL-3 | Absent |
| Comparative Example 3-4 | Comparative UDL-4 | Absent |
| Comparative Example 3-5 | Comparative UDL-5 | Present |

As shown by Examples 3-1 to 3-18 in Table 11, it has been revealed that every resist underlayer film material of the present invention was able to fill the hole patterns without voids, and was excellent in filling property. On the other hand, in Comparative Example 3-5, it can be considered that a sudden curing reaction occurred due to the action of the thermal acid generator since a polymer was used, and that therefore, thermal flowability was insufficient, and voids due to poor filling occurred.

Example 4: Planarizing Property Evaluation (Examples 4-1 to 4-18, Comparative Examples 4-1 to 4-5)

The resist underlayer film materials (UDL-1 to -18, comparative UDL- 1 to -5) prepared above were each applied onto a base substrate 9 (SiO$_2$ wafer substrate) having a giant isolated trench pattern (FIG. 3 (J), trench width: 10 μm, trench depth: 0.1 μm) and baked at 250° C. for 60 seconds. Then, a step (delta 10 in FIG. 3 (K)) between the trench portion and the non-trench portion of a resist underlayer film 10 was observed with an atomic force microscope (AFM) NX10 manufactured by Park systems Corp. Table 12 shows the results. In this evaluation, the smaller the step, the better the planarizing property. Note that, in this evaluation, a trench pattern having a depth of 0.10 μm was generally planarized using a resist underlayer film material having a film thickness of approximately 0.2 μm. This is a severe evaluation condition to evaluate the planarizing property.

TABLE 12

| | Resist underlayer film material | Step (nm) |
|---|---|---|
| Example 4-1 | UDL-1 | 35 |
| Example 4-2 | UDL-2 | 20 |
| Example 4-3 | UDL-3 | 25 |
| Example 4-4 | UDL-4 | 25 |
| Example 4-5 | UDL-5 | 20 |
| Example 4-6 | UDL-6 | 30 |
| Example 4-7 | UDL-7 | 20 |
| Example 4-8 | UDL-8 | 35 |
| Example 4-9 | UDL-9 | 20 |
| Example 4-10 | UDL-10 | 25 |
| Example 4-11 | UDL-11 | 20 |
| Example 4-12 | UDL-12 | 30 |
| Example 4-13 | UDL-13 | 35 |
| Example 4-14 | UDL-14 | 20 |
| Example 4-15 | UDL-15 | 25 |
| Example 4-16 | UDL-16 | 25 |
| Example 4-17 | UDL-17 | 10 |
| Example 4-18 | UDL-18 | 15 |
| Comparative Example 4-1 | Comparative UDL-1 | 40 |
| Comparative Example 4-2 | Comparative UDL-2 | 50 |
| Comparative Example 4-3 | Comparative UDL-3 | 45 |
| Comparative Example 4-4 | Comparative UDL-4 | 45 |
| Comparative Example 4-4 | Comparative UDL-5 | 90 |

As shown by Examples 4-1 to 4-18 in Table 12, the resist underlayer films had smaller steps between the trench portion and the non-trench portion when the inventive resist underlayer film materials were used, compared with Comparative Examples 4-1 to 4-5, showing that planarizing property was excellent. In particular, it can be observed that with the materials having a naphthalene-type terminal group structure, a denser film was formed, as shown in the results of Example 1, compared with Examples 4-1, 4-1 an 4-13 where a benzene-type terminal group structure was contained. Thus, film shrinking was suppressed, and planarizing performance was improved. In addition, comparing Examples 4-9 and 4-10 with Comparative Examples 4-1, 4-3, and 4-4, where the structure of terminal groups are different, it can be seen that flatness has been improved by the effect of the catechol terminal group. Comparing Examples 4-9 and 4-10 with Comparative Example 4-2, it can be seen that if a catechol terminal structure is introduced excessively, curability is degraded as shown in Example 1, so that heat resistance is also degraded. Thus, flatness is degraded due to the influence of film shrinking. Meanwhile, in Comparative Example 4-5, thermal flowability was insufficient since a polymer was used. Therefore, a favorable result was not achieved regarding planarizing performance, as in Example 3. Comparing Examples 4-17 and 4-18, in which a high-boiling-point solvent was added with Examples 4-10 and 4-15, in which a high-boiling point solvent was not added, it can also be seen that flatness was further improved by the addition of the high-boiling-point solvent.

Example 5: Patterning Test (Examples 5-1 to 5-13, Comparative Examples 5-1 to 5-5)

UDL-2 to -5, -7, -9 to -11, and -14 to -18, and Comparative Examples UDL-1 to -5 prepared above were each applied onto a SiO$_2$ substrate having a trench pattern (trench width: 10 μm, trench depth: 0.10 μm) with a SiO$_2$ film formed, the SiO$_2$ film having a film thickness of 200 nm treated with HMDS. Then, a resist underlayer film was formed by baking at 250° C. for 60 seconds in the atmosphere so that the film thickness on the Bare-Si substrate was 200 nm. A silicon-containing resist middle layer material (SOG-1) was applied onto the resist underlayer film and baked at 220° C. for 60 seconds to form a resist middle layer film having a film thickness of 35 nm. A resist upper layer film material (SL resist for ArF) was applied thereon and baked at 105° C. for 60 seconds to form a resist upper layer film having a film thickness of 100 nm. A liquid immersion top coat (TC-1) was applied onto the resist upper layer film and baked at 90° C. for 60 seconds to form a top coat having a film thickness of 50 nm.

The resist upper layer film material (SL resist for ArF) was prepared by: dissolving a polymer (RP1), an acid generator (PAG1), and a basic compound (Amine1) into a solvent containing 0.1 mass % FC-430 (manufactured by Sumitomo 3M Ltd.) in proportions shown in Table 13; and filtering the solution through a 0.1-μm filter made of a fluorinated resin.

TABLE 13

|  | Polymer (parts by mass) | Acid generator (parts by mass) | Basic compound (parts by mass) | Solvent (parts by mass) |
|---|---|---|---|---|
| SL resist for ArF | RP1 (100) | PAG1 (6.6) | Amine1 (0.8) | PGMEA (2500) |

The structural formulae of the polymer (RP1), acid generator (PAG1), and basic compound (Amine1) used are shown below.

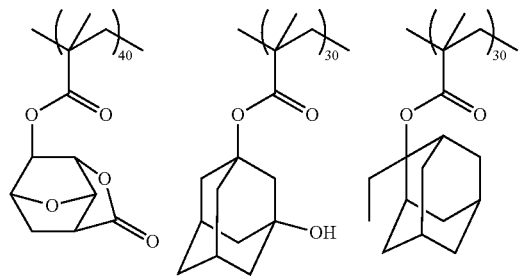

RP1
Mw7.800

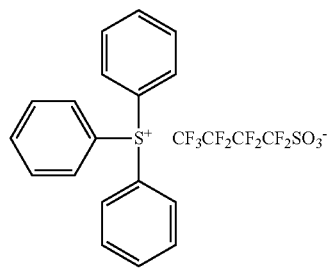

PAG1

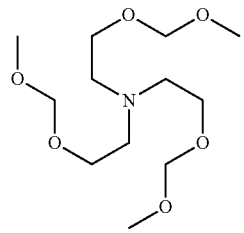

Amine1

The liquid immersion top coat material (TC-1) was prepared by: dissolving a top coat polymer (PP1) into organic solvents in proportions shown in Table 14; and filtering the solution through a 0.1-μm filter made of a fluorinated resin.

TABLE 14

|  | Polymer (parts by mass) | Organic solvent (parts by mass) |
|---|---|---|
| TC-1 | PP1 (100) | Diisoamyl ether (2700) 2-methyl-1-butanol (270) |

The structural formula of the used polymer (PP1) is shown below.

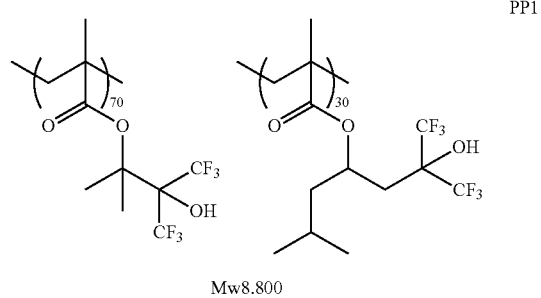

PP1
Mw8.800

The silicon-containing resist middle layer material (SOG-1) was prepared by: dissolving a polymer shown by an ArF silicon-containing middle layer film polymer (SiP1) and a crosslinking catalyst (CAT1) into an organic solvent containing 0.1 mass % FC-4430 (manufactured by Sumitomo 3M Ltd.) in proportions shown in Table 15; and filtering the solution through a filter made of a fluorinated resin with a pore size of 0.1 μm.

TABLE 15

|  | Polymer (parts by mass) | Thermally crosslinking catalyst (parts by mass) | Organic solvent (parts by mass) |
|---|---|---|---|
| SOG-1 | SiP1 (100) | CAT1 (1) | Propylene glycol monoethyl ether (4000) |

The structural formulae of the used ArF silicon-containing middle layer film polymer (SiP1) and crosslinking catalyst (CAT1) are shown below.

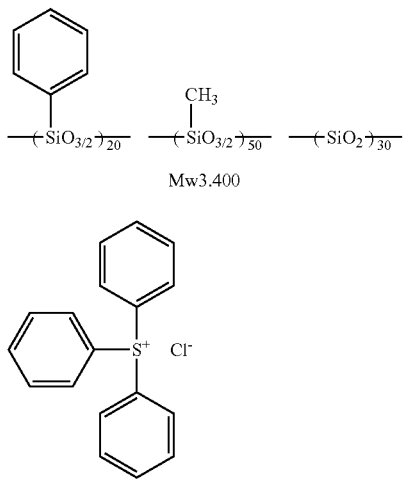

Next, the resulting substrate was exposed to light with an ArF liquid immersion exposure apparatus (NSR-S610C manufactured by Nikon Corporation, NA: 1.30, σ: 0.98/0.65, 35° s-polarized dipole illumination, 6% halftone phase shift mask) while changing the exposure, baked (PEB) at 100° C. for 60 seconds, and developed with a 2.38 mass % tetramethylammonium hydroxide (TMAH) aqueous solution for 30 seconds. Thus, a positive line and space pattern was obtained with a pitch of 100 nm and a resist line width of 50 nm to 30 nm.

Next, using an etching apparatus Telius manufactured by Tokyo Electron Limited, the silicon-containing middle layer was processed by dry etching while using the resist pattern as a mask; the underlayer film was processed while using the silicon-containing middle layer as a mask; and the $SiO_2$ film was processed while using the underlayer film as a mask.

The etching conditions were as follows.

Conditions for transferring the resist pattern to the SOG film.
Chamber pressure: 10.0 Pa
RF power: 1,500 W
$CF_4$ gas flow rate: 15 sccm
$O_2$ gas flow rate: 75 sccm
Time: 15 sec Conditions for transferring the SOG film pattern to the underlayer film.
Chamber pressure: 2.0 Pa
RF power: 500 W
Ar gas flow rate: 75 sccm
$O_2$ gas flow rate: 45 sccm
Time: 120 sec Conditions for transferring the underlayer film pattern to the $SiO_2$ film.
Chamber pressure: 2.0 Pa
RF power: 2,200 W
$C_5F_{12}$ gas flow rate: 20 sccm
$C_2F_6$ gas flow rate: 10 sccm
Ar gas flow rate: 300 sccm
$O_2$ gas flow rate: 60 sccm
Time: 90 sec The pattern cross sections were observed with an electron microscope (S-4700) manufactured by Hitachi, Ltd., the profiles were compared, and summarized in Table 16.

TABLE 16

| | Resist underlayer film material | Pattern profile after etching for transferring to substrate |
|---|---|---|
| Example 5-1 | UDL-2 | Vertical profile |
| Example 5-2 | UDL-3 | Vertical profile |
| Example 5-3 | UDL-4 | Vertical profile |
| Example 5-4 | UDL-5 | Vertical profile |
| Example 5-5 | UDL-7 | Vertical profile |
| Example 5-6 | UDL-9 | Vertical profile |
| Example 5-7 | UDL-10 | Vertical profile |
| Example 5-8 | UDL-11 | Vertical profile |
| Example 5-9 | UDL-14 | Vertical profile |
| Example 5-10 | UDL-15 | Vertical profile |
| Example 5-11 | UDL-16 | Vertical protlie |
| Example 5-12 | UDL-17 | Vertical profile |
| Example 5-13 | UDL-18 | Vertical profile |
| Comparative Example 5-1 | Comparative UDL-1 | Pattern profile collapse |
| Comparative Example 5-2 | Comparative UDL-2 | Pattern profile collapse |
| Comparative Example 5-3 | Comparative UDL-3 | Pattern profile collapse |
| Comparative Example 5-4 | Comparative UDL-4 | Pattern profile collapse |
| Comparative Example 5-5 | Comparative UDL-5 | Pattern profile collapse |

As shown in Table 16, it was confirmed from the results of the inventive resist underlayer film materials (Examples 5-1 to 5-13) that the resist upper layer film pattern was favorably transferred to the final substrate in each case, and that the inventive resist underlayer film materials are suitably used in fine processing according to the multilayer resist method. On the other hand, in Comparative Examples 5-1, 5-3, and 5-4, pattern collapse occurred during patterning due to pinholes generated during film formation as demonstrated in the results of the film-formability test of Example 2, and it was not possible to form a pattern. In Comparative Example 5-2, as demonstrated in the results of Example 1, curability was somewhat insufficient, so that intermixing with the upper layer occurred during formation of the SOG film, and it was not possible to transfer the pattern. In Comparative Example 5-5, as demonstrated in Example 3 and Example 4, filling property and planarizing property were poor, so that pattern collapse occurred during patterning, and it was not possible to form a pattern.

From the above, it was revealed that the inventive resist underlayer film materials have good film-formability and excellent filling and planarizing properties. Thus, the inventive resist underlayer film materials are extremely useful as organic film materials used in multilayer resist methods. Moreover, the inventive patterning process using these materials can form a fine pattern with high precision even when the body to be processed is a stepped substrate.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A resist underlayer film material for use in a multilayer resist method, comprising:
(A) one or more compounds shown by the following general formula (1); and
(B) an organic solvent,

$$W\text{-}(X)_n \quad (1)$$

wherein W in the general formula (1) is represented by the following general formula (9); X represents either of terminal group structures shown by the following general formula (2) and the following general formula (3); when a ratio of the structure of the following general formula (2) to the structure of the following general formula (3) each constituting the X is "a" to "b", "a" and "b" satisfy the relations a+b=1.0, 0.70≤a≤0.99, and 0.01≤b≤0.30; and "n" represents an integer of 1 to 10, and the general formula (2) is any one of the following formula (4) formula (5) or formula (6), and the general formula (3) is either one of the following formula (7) or formula (8), (2)

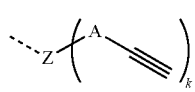

wherein a broken line represents a bonding arm; Z represents an aromatic group with a valency of (k+1) having 6 to 20 carbon atoms; A represents a single bond or —O—$(CH_2)_p$—; "k" represents an integer of 1 to 5; and "p" represents an integer of 1 to 10, (3)

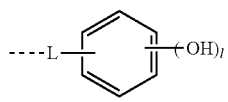

wherein a broken line represents a bonding arm; L represents a single bond or —$(CH_2)_r$—; "l" represents 2 or 3; and "r" represents an integer of 1 to 5, (4)
(5)
(6)

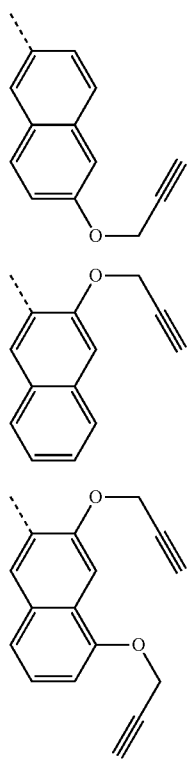

wherein a broken line represents a bonding arm, (7)

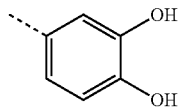

(8)

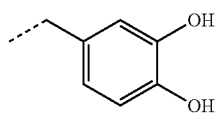

wherein a broken line represents a bonding arm, (9)

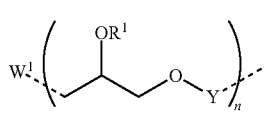

wherein a broken line represents a bonding arm; $R^1$ represents a hydrogen atom or an alkyl group or an acyl group having 1 to 20 carbon atoms and optionally having an oxygen atom or a nitrogen atom; $W^1$ represents a structure shown by any of the following formulae; Y represents a single bond or a carbonyl group; and "n" represents an integer of 1 to 10,

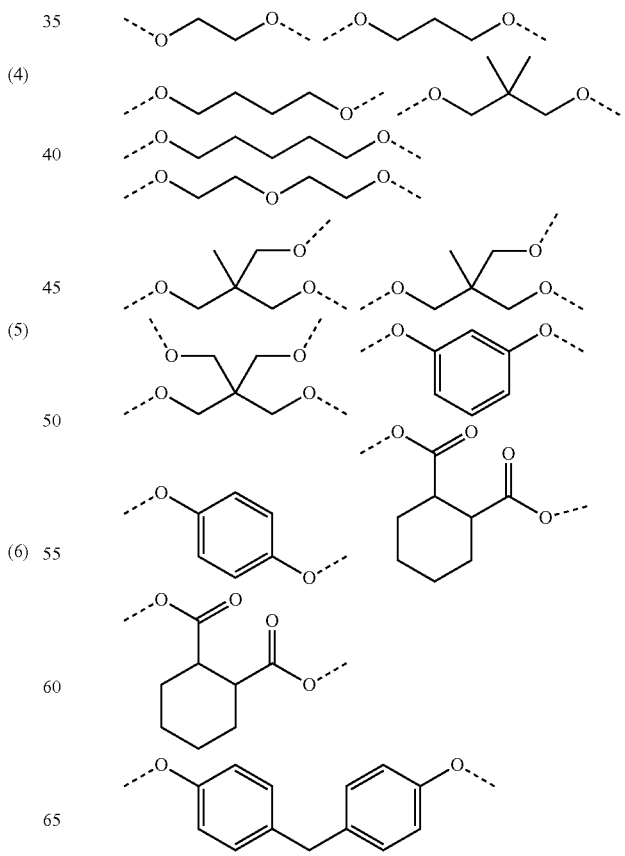

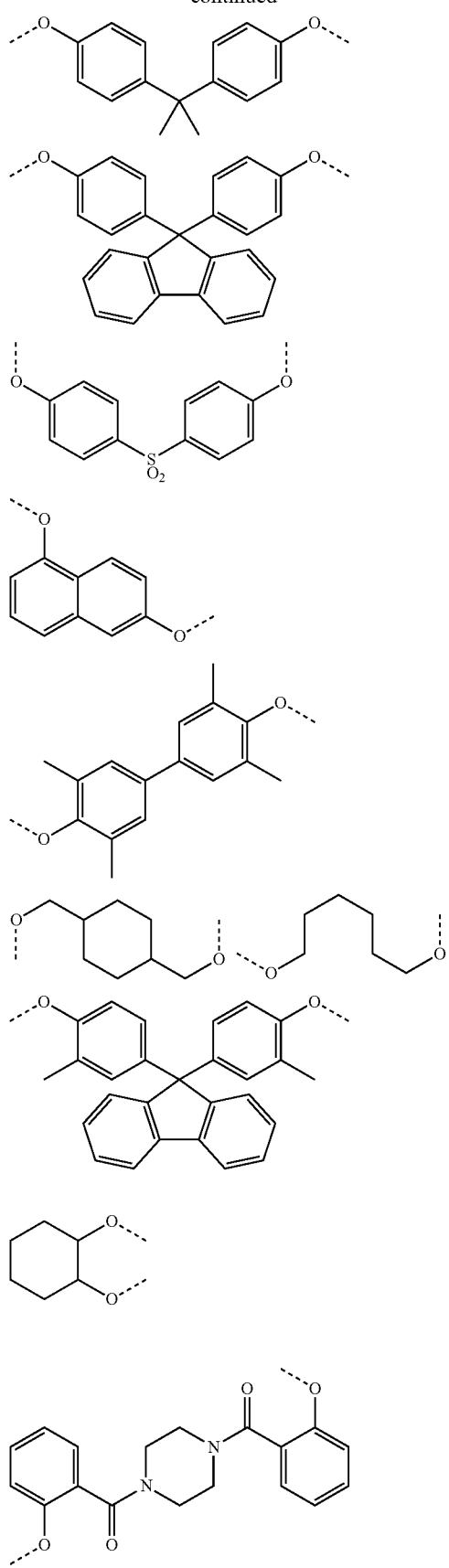
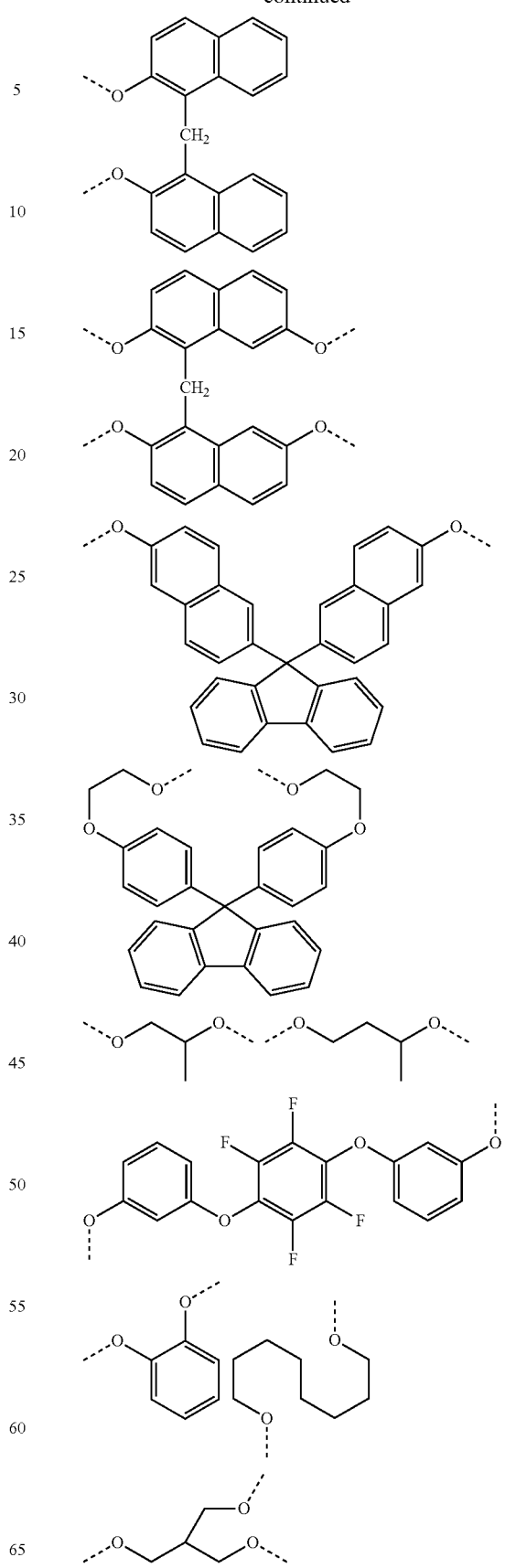

77
-continued
78
-continued
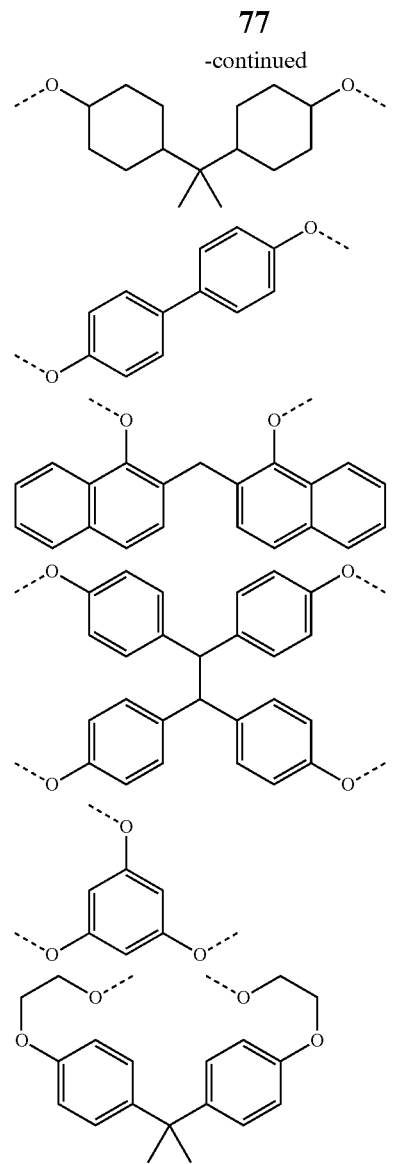
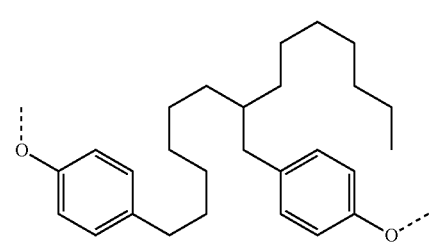
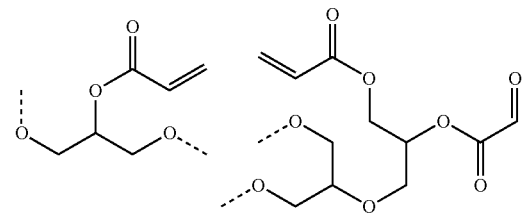
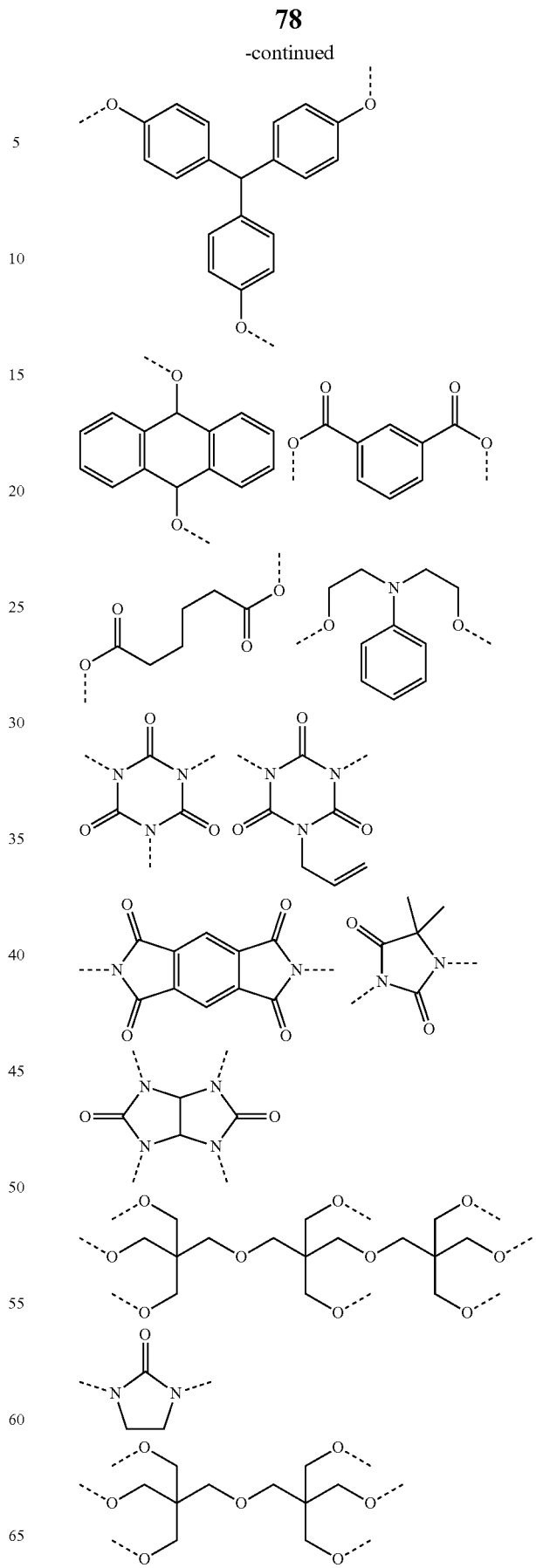

-continued

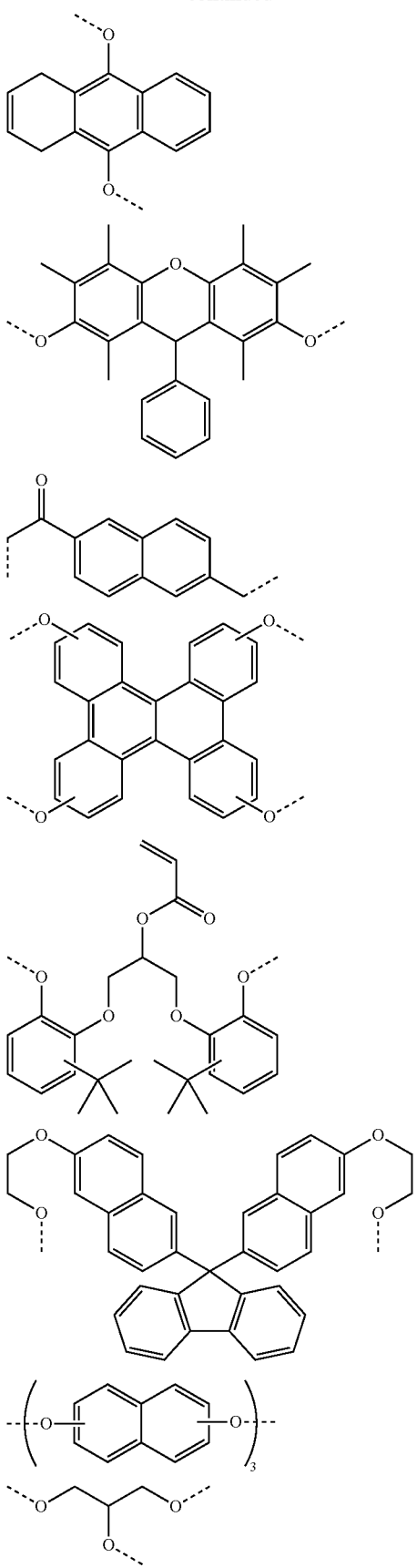

-continued

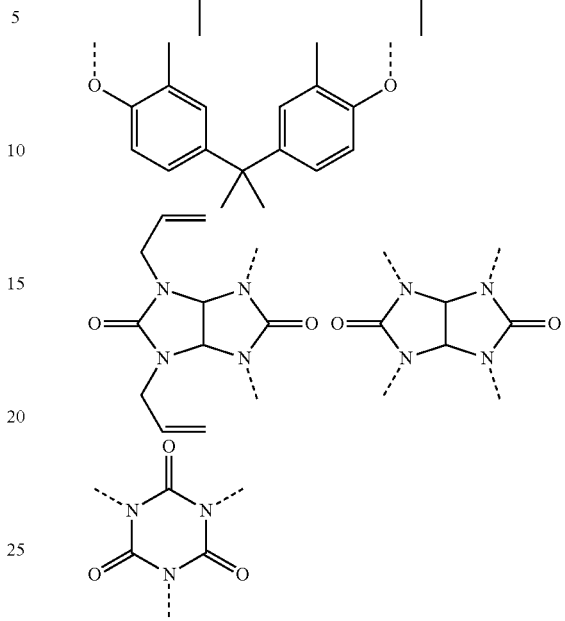

wherein a broken line represents a bonding arm.

2. The resist underlayer film material according to claim 1, wherein (B) the organic solvent is a mixture of one or more organic solvents each having a boiling point of lower than 180° C. and one or more organic solvents each having a boiling point of 180° C. or higher.

3. The resist underlayer film material according to claim 1, further comprising one or more of (C) an acid generator, (D) a surfactant, (E) a crosslinking agent, (F) a plasticizer, and (G) a colorant.

4. A patterning process for forming a pattern in a substrate to be processed, comprising the steps of:
(I-1) applying the resist underlayer film material according to claim 1 on the substrate to be processed and then performing a heat treatment to form a resist underlayer film;
(I-2) forming a resist upper layer film on the resist underlayer film by using a photoresist material;
(I-3) subjecting the resist upper layer film to pattern exposure and then to development with a developer to form a pattern in the resist upper layer film;
(I-4) transferring the pattern to the resist underlayer film by dry etching while using the resist upper layer film having the formed pattern as a mask; and
(I-5) processing the substrate to be processed while using the resist underlayer film having the formed pattern as a mask to form the pattern in the substrate to be processed.

5. A patterning process for forming a pattern in a substrate to be processed, comprising the steps of:
(II-1) applying the resist underlayer film material according to claim 1 on the substrate to be processed and then performing a heat treatment to form a resist underlayer film;
(II-2) forming a resist middle layer film on the resist underlayer film;
(II-3) forming a resist upper layer film on the resist middle layer film by using a photoresist material;

(II-4) subjecting the resist upper layer film to pattern exposure and then to development with a developer to form a pattern in the resist upper layer film;

(II-5) transferring the pattern to the resist middle layer film by dry etching while using the resist upper layer film having the formed pattern as a mask;

(II-6) transferring the pattern to the resist underlayer film by dry etching while using the resist middle layer film having the transferred pattern as a mask; and (II-7) processing the substrate to be processed while using the resist underlayer film having the formed pattern as a mask to form the pattern in the substrate to be processed.

6. The patterning process according to claim 5, wherein a substrate having a structure or a step with a height of 30 nm or more is used as the substrate to be processed.

7. A patterning process for forming a pattern in a substrate to be processed, comprising the steps of:

(III-1) applying the resist underlayer film material according to claim 1 on the substrate to be processed and then performing a heat treatment to form a resist underlayer film;

(III-2) forming an inorganic hard mask middle layer film selected from a silicon oxide film, a silicon nitride film, and a silicon oxynitride film on the resist underlayer film;

(III-3) forming an organic thin film on the inorganic hard mask middle layer film;

(III-4) forming a resist upper layer film on the organic thin film by using a photoresist material;

(III-5) subjecting the resist upper layer film to pattern exposure and then to development with a developer to form a pattern in the resist upper layer film;

(III-6) transferring the pattern to the organic thin film and the inorganic hard mask middle layer film by dry etching while using the resist upper layer film having the formed pattern as a mask;

(III-7) transferring the pattern to the resist underlayer film by dry etching while using the inorganic hard mask middle layer film having the transferred pattern as a mask; and (III-8) processing the substrate to be processed while using the resist underlayer film having the formed pattern as a mask to form the pattern in the substrate to be processed.

8. A method for forming a resist underlayer film that functions as an organic flat film employed in a semiconductor device manufacturing process, the method comprising:
spin-coating a substrate to be processed with the resist underlayer film material according to claim 1; and
heating the substrate coated with the resist underlayer film material at a temperature of 100° C. or higher to 600° C. or lower for 10 to 600 seconds to form a cured film.

9. The method for forming a resist underlayer film according to claim 8, wherein a substrate having a structure or a step with a height of 30 nm or more is used as the substrate to be processed.

10. A method for forming a resist underlayer film that functions as an organic flat film employed in a semiconductor device manufacturing process, the method comprising:
spin-coating a substrate to be processed with the resist underlayer film material according to claim 1; and
heating the substrate coated with the resist underlayer film material in an atmosphere having an oxygen concentration of 1% or more to 21% or less to form a cured film.

11. A method for forming a resist underlayer film that functions as an organic flat film employed in a semiconductor device manufacturing process, the method comprising:
spin-coating a substrate to be processed with the resist underlayer film material according to claim 1; and
heating the substrate coated with the resist underlayer film material in an atmosphere having an oxygen concentration of less than 1% to form a cured film.

\* \* \* \* \*